United States Patent
Hwang et al.

(10) Patent No.: US 7,672,154 B2
(45) Date of Patent: Mar. 2, 2010

(54) SEMICONDUCTOR MEMORY DEVICE AND METHOD OF PROGRAMMING THE SAME

(75) Inventors: In-jun Hwang, Yongin-si (KR); Hyung-soon Shin, Seoul (KR); Seung-jun Lee, Seoul (KR); Sun-ae Seo, Hwaseong-si (KR); Kee-won Kim, Suwon-si (KR); Kwang-seok Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 165 days.

(21) Appl. No.: 12/073,678

(22) Filed: Mar. 7, 2008

(65) Prior Publication Data

US 2009/0122596 A1   May 14, 2009

(30) Foreign Application Priority Data

Nov. 8, 2007   (KR) .................... 10-2007-0113875

(51) Int. Cl.
    *G11C 11/00*   (2006.01)
(52) U.S. Cl. ..................................... 365/158; 365/171
(58) Field of Classification Search ................. 365/148, 365/158, 171, 230.06, 230.07, 232
    See application file for complete search history.

(56) References Cited

U.S. PATENT DOCUMENTS

| | | | | |
|---|---|---|---|---|
| 3,223,985 A | * | 12/1965 | Hart et al. | 365/61 |
| 6,314,020 B1 | * | 11/2001 | Hansen et al. | 365/158 |
| 7,342,822 B2 | * | 3/2008 | Ezaki et al. | 365/158 |
| 2006/0098478 A1 | * | 5/2006 | Ezaki et al. | 365/158 |

\* cited by examiner

*Primary Examiner*—Gene N. Auduong
(74) *Attorney, Agent, or Firm*—Harness, Dickey & Pierce, P.L.C.

(57) ABSTRACT

Provided are a semiconductor memory device and a method of programming the same. The semiconductor memory device includes a mode input value generating unit and a logic operating unit. The mode input value generating unit changes a connection state between input values of a current driving circuit so as to correspond to each of at least two operating modes, and defines a logic function of a magnetic memory cell connected to the current driving circuit in response to each operating mode. The logic operating unit performs a logic operation on the logic functions of at least two magnetic memory cells defined according to each of the operating modes and generates a result of logic operation.

17 Claims, 43 Drawing Sheets

| A | B | C | D |
|---|---|---|---|
| −I(0) | −I(0) | −I(0) | $R_L$(0) |
| −I(0) | −I(0) | +I(1) | $R_L$(0) |
| −I(0) | +I(1) | −I(0) | $R_L$(0) |
| +I(1) | −I(0) | −I(0) | $R_L$(0) |
| −I(0) | +I(1) | +I(1) | $R_H$(1) |
| +I(1) | −I(0) | +I(1) | $R_H$(1) |
| +I(1) | +I(1) | −I(0) | $R_H$(1) |
| +I(1) | +I(1) | +I(1) | $R_H$(1) |

FIG. 3B
| A | B | C | CURRENT | R |
|---|---|---|---------|---|
| 0 | 0 | 0 | −3I | $R_L(0)$ |
| 0 | 0 | 1 | −I | $R_L(0)$ |
| 0 | 1 | 0 | −I | $R_L(0)$ |
| 1 | 0 | 0 | −I | $R_L(0)$ |
| 0 | 1 | 1 | +I | $R_H(1)$ |
| 1 | 0 | 1 | +I | $R_H(1)$ |
| 1 | 1 | 0 | +I | $R_H(1)$ |
| 1 | 1 | 1 | +3I | $R_H(1)$ |
FIG. 3C
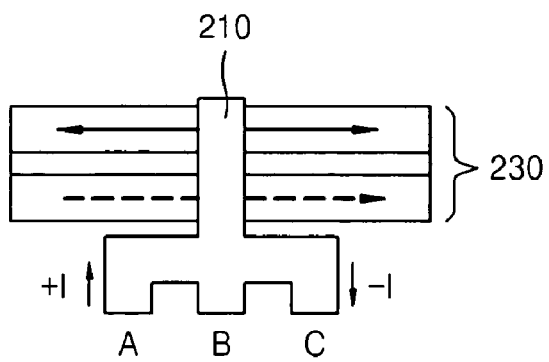
FIG. 3D
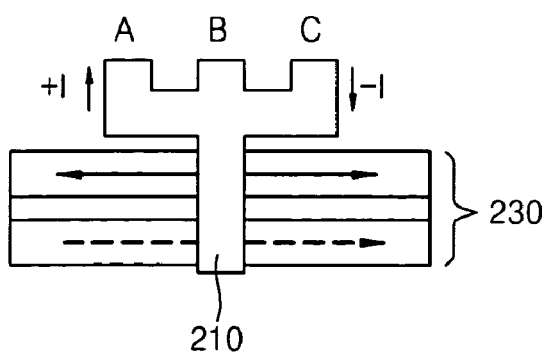

| A | B | C | CURRENT | R |
|---|---|---|---------|---|
| 0 | 0 | 0 | +3I | $R_H(1)$ |
| 0 | 0 | 1 | +I | $R_H(1)$ |
| 0 | 1 | 0 | +I | $R_H(1)$ |
| 1 | 0 | 0 | +I | $R_H(1)$ |
| 0 | 1 | 1 | −I | $R_L(0)$ |
| 1 | 0 | 1 | −I | $R_L(0)$ |
| 1 | 1 | 0 | −I | $R_L(0)$ |
| 1 | 1 | 1 | −3I | $R_L(0)$ |

| A | B | CURRENT | R |
|---|---|---------|---|
| 0 | 0 | -3I | R$_L$(0) |
| 0 | 1 | -I | R$_L$(0) |
| 1 | 0 | -I | R$_L$(0) |
| 1 | 1 | +I | R$_H$(1) |

| A | B | CURRENT | R |
|---|---|---|---|
| 0 | 0 | −I | $R_L(0)$ |
| 0 | 1 | +I | $R_H(1)$ |
| 1 | 0 | +I | $R_H(1)$ |
| 1 | 1 | +3I | $R_H(1)$ |

| A | B | CURRENT | R |
|---|---|---------|---|
| 0 | 0 | +3I | $R_H(1)$ |
| 0 | 1 | +I | $R_H(1)$ |
| 1 | 0 | +I | $R_H(1)$ |
| 1 | 1 | −I | $R_L(0)$ |

| A | B | CURRENT | R |
|---|---|---------|---|
| 0 | 0 | +I | $R_H(1)$ |
| 0 | 1 | -I | $R_L(0)$ |
| 1 | 0 | -I | $R_L(0)$ |
| 1 | 1 | -3I | $R_L(0)$ |

S/A OUT = $V_+$ AND $\overline{V_-}$

| $V_+$ (R1) | $V_-$ (R2) | OUT |
|---|---|---|
| 0($R_L$) | 0($R_L$) | 0 |
| 0($R_L$) | 1($R_H$) | 0 |
| 1($R_H$) | 0($R_L$) | 1 |
| 1($R_H$) | 1($R_H$) | 0 |

S/A OUT = $V_+$ AND $\overline{V_-}$

= (A OR B) · $\overline{\text{(A AND B)}}$

= (A + B) · ($\overline{A}$ + $\overline{B}$)

= A · $\overline{B}$ + $\overline{A}$ · B

= A XOR B

FIG. 11A
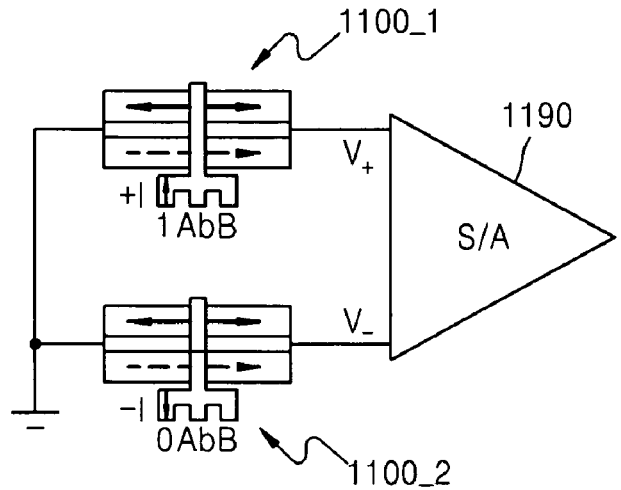
FIG. 11B
S/A OUT = $V_+$ AND $\overline{V_-}$
$= (\overline{A} \text{ OR } B) \cdot \overline{(\overline{A} \text{ AND } B)}$
$= (\overline{A} + B) \cdot (A + \overline{B})$
$= A \cdot B + \overline{A} \cdot \overline{B}$
$= A \text{ XNOR } B$
FIG. 12A
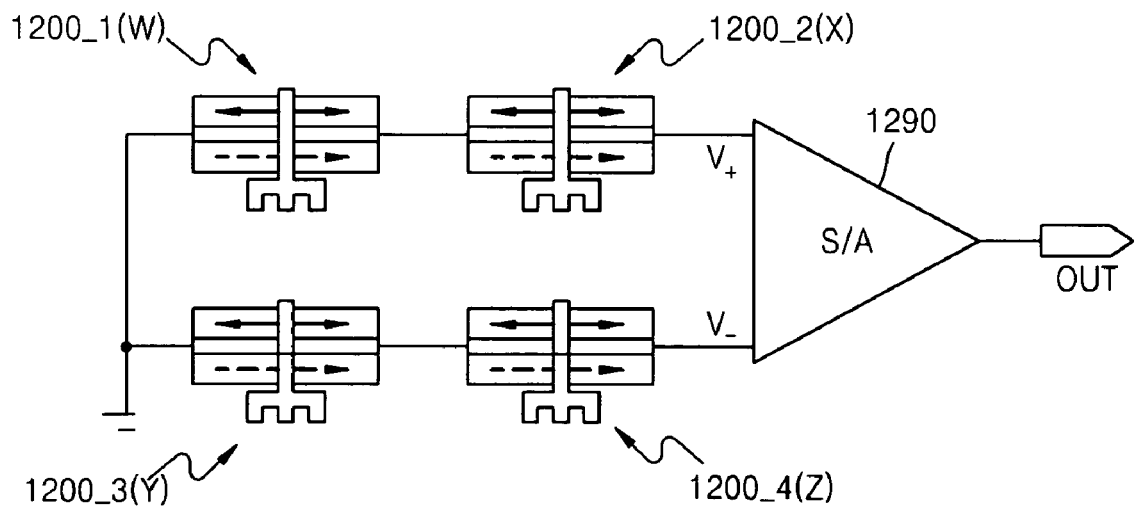

FIG. 12B $$S/A\ OUT = (W + X) \cdot \overline{Y} \cdot \overline{Z} + (\overline{Y} + \overline{Z}) \cdot W \cdot X$$

FIG. 12C

| W | X | Y | Z | OUT |
|---|---|---|---|-----|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 1 |
| 0 | 1 | 0 | 1 | 0 |
| 0 | 1 | 1 | 0 | 0 |
| 0 | 1 | 1 | 1 | 0 |
| 1 | 0 | 0 | 0 | 1 |
| 1 | 0 | 0 | 1 | 0 |
| 1 | 0 | 1 | 0 | 0 |
| 1 | 0 | 1 | 1 | 0 |
| 1 | 1 | 0 | 0 | 1 |
| 1 | 1 | 0 | 1 | 1 |
| 1 | 1 | 1 | 0 | 1 |
| 1 | 1 | 1 | 1 | 0 |

FIG. 13B $A_{NEXT} = (\overline{B} + C) \cdot \overline{(\overline{B} + C)}$
$\phantom{A_{NEXT}} = (\overline{B} + C) \cdot (B + \overline{C})$
$\phantom{A_{NEXT}} = \overline{B \oplus C}$ $B_{NEXT} = (\overline{A} + \overline{C}) \cdot \overline{(\overline{A} + B)}$
$\phantom{B_{NEXT}} = (\overline{A} + \overline{C}) \cdot (A + \overline{B})$
$\phantom{B_{NEXT}} = \overline{A} \cdot B + A \cdot \overline{C} + B \cdot \overline{C}$ $W = \overline{A} + C$
$X = R_L(0)$
$Y = \overline{A} \cdot \overline{B}$
$Z = R_L(0)$
$C_{NEXT} = \{(\overline{A} + C + 0) \cdot \overline{(\overline{A} + B)} \cdot \overline{(0)}\} + \{(\overline{(\overline{A} \cdot \overline{B})} + \overline{(0)}) \cdot (\overline{A} + C) \cdot 0\}$
$\phantom{C_{NEXT}} = (\overline{A} + C) \cdot (A + B) \cdot 1$
$\phantom{C_{NEXT}} = \overline{A} \cdot B + A \cdot C + B \cdot C$

FIG. 13C

| PRESENT STATE C B A | NEXT STATE C B A |
|---|---|
| 0 0 0 | 0 0 1 |
| 0 0 1 | 0 1 1 |
| 0 1 1 | 0 1 0 |
| 0 1 0 | 1 1 0 |
| 1 1 0 | 1 1 1 |
| 1 1 1 | 1 0 1 |
| 1 0 1 | 1 0 0 |
| 1 0 0 | 0 0 0 |

FIG. 14B $A_{NEXT} = (\bar{A}+B) \cdot \overline{(A \cdot \bar{B})} = (\bar{A}+B) \cdot (\bar{A}+B) = \bar{A}$ $B_{NEXT} = (A+B) \cdot \overline{(A \cdot B)} = (A+B) \cdot (\bar{A}+\bar{B}) = A \cdot \bar{B} + \bar{A} \cdot B = A \oplus B$ $W = R_H(1)$ $X = A \cdot B + B \cdot C + C \cdot A$ $Y = A \cdot C$ $Z = B + \bar{C}$ $C_{NEXT} = \{(1 + A \cdot B + B \cdot C + C \cdot A) \cdot \overline{(A \cdot C)} \cdot \overline{(B+\bar{C})}\}$ $\qquad + \{(\overline{(A \cdot C)} + \overline{(B+\bar{C})}) \cdot (A \cdot B + B \cdot C + C \cdot A) \cdot 1\}$ $\qquad = \{\overline{(A \cdot C)} \cdot (\bar{B} \cdot C)\} + \{(\overline{(A \cdot C)} + (\bar{B} \cdot C)) \cdot (A \cdot B + B \cdot C + C \cdot A)\}$ $\qquad = \bar{A} \cdot \bar{B} \cdot C + \bar{A} \cdot B \cdot C + A \cdot B \cdot \bar{C} + A \cdot \bar{B} \cdot C$ $\qquad = A \cdot B \cdot \bar{C} + \bar{A} \cdot C + \bar{B} \cdot C$

FIG. 14C

| PRESENT STATE C B A | NEXT STATE C B A |
|---|---|
| 0 0 0 | 0 0 1 |
| 0 0 1 | 0 1 0 |
| 0 1 0 | 0 1 1 |
| 0 1 1 | 1 0 0 |
| 1 0 0 | 1 0 1 |
| 1 0 1 | 1 1 0 |
| 1 1 0 | 1 1 1 |
| 1 1 1 | 0 0 0 |

FIG. 15B $$A_{NEXT} = (\bar{A} + B) \cdot \overline{(A \cdot \bar{B})} = (\bar{A} + B) \cdot (\bar{A} + B) = \bar{A}$$

$$B_{NEXT} = (\bar{A} + B) \cdot \overline{(\bar{A} \cdot B)} = (\bar{A} + B) \cdot (A + \bar{B}) = A \cdot B + \bar{A} \cdot \bar{B} = \overline{A \oplus B}$$

$$W = B \cdot C$$

$$X = \bar{A} \cdot \bar{B} + \bar{B} \cdot C + C \cdot \bar{A}$$

$$Y = R_L(0)$$

$$Z = \bar{A} \cdot C$$

$$C_{NEXT} = \{(B \cdot C + \bar{A} \cdot \bar{B} + \bar{B} \cdot C + C \cdot \bar{A}) \cdot 1 \cdot \overline{(\bar{A} \cdot C)}\}$$

$$+ \{(1 + \overline{(\bar{A} \cdot C)}) \cdot (B \cdot C) \cdot (\bar{A} \cdot \bar{B} + \bar{B} \cdot C + C \cdot \bar{A})\}$$

$$= \{(B \cdot C + \bar{A} \cdot \bar{B} + \bar{B} \cdot C) \cdot (A + \bar{C})\} + \{(B \cdot C) \cdot (\bar{A} \cdot \bar{B} + \bar{B} \cdot C + C \cdot \bar{A})\}$$

$$= A \cdot B \cdot C + A \cdot \bar{B} \cdot C + \bar{A} \cdot \bar{B} \cdot \bar{C} + \bar{A} \cdot B \cdot C$$

$$= \bar{A} \cdot \bar{B} \cdot \bar{C} + A \cdot C + B \cdot C$$

FIG. 15C

| PRESENT STATE C B A | NEXT STATE C B A |
|---|---|
| 1 1 1 | 1 1 0 |
| 1 1 0 | 1 0 1 |
| 1 0 1 | 1 0 0 |
| 1 0 0 | 0 1 1 |
| 0 1 1 | 0 1 0 |
| 0 1 0 | 0 0 1 |
| 0 0 1 | 0 0 0 |
| 0 0 0 | 1 1 1 |

FIG. 16B

S/A OUT = $(W+X) \cdot \bar{Y} \cdot \bar{Z} + (\bar{Y}+\bar{Z}) \cdot W \cdot X$ $W_A = R_H(1)$
$X_A = B \cdot C + C \cdot D + D \cdot B$
$Y_A = \bar{B} \cdot C + C \cdot D + D \cdot \bar{B}$
$Z_A = B \cdot \bar{C} + \bar{C} \cdot D + D \cdot B$ $A_{NEXT} = \{(1+B \cdot C+C \cdot D+D \cdot B) \cdot \overline{(\bar{B} \cdot C+C \cdot D+D \cdot \bar{B})} \cdot \overline{(B \cdot \bar{C}+\bar{C} \cdot D+D \cdot B)}\}$
$\qquad +\{(\overline{(\bar{B} \cdot C+C \cdot D+D \cdot \bar{B})}+\overline{(B \cdot \bar{C}+\bar{C} \cdot D+D \cdot B)}) \cdot 1 \cdot (B \cdot C+C \cdot D+D \cdot B)\}$
$\qquad = \{(B \cdot \bar{C}+\bar{C} \cdot \bar{D}+\bar{D} \cdot B) \cdot (\bar{B} \cdot C+C \cdot \bar{D}+\bar{D} \cdot \bar{B})\} + \{B \cdot \bar{C} \cdot D + \bar{B} \cdot C \cdot D + B \cdot C \cdot \bar{D}\}$
$\qquad = \bar{B} \cdot \bar{C} \cdot \bar{D} + B \cdot C \cdot \bar{D} + \bar{B} \cdot C \cdot D + B \cdot \bar{C} \cdot D$ $W_B = \bar{A} \cdot \bar{C} + \bar{C} \cdot \bar{D} + \bar{D} \cdot \bar{A}$
$X_B = C \cdot D$
$Y_B = \bar{A} \cdot \bar{B}$
$Z_B = R_L(0)$ $B_{NEXT} = \{(\bar{A} \cdot \bar{C} + \bar{C} \cdot \bar{D} + \bar{D} \cdot \bar{A} + C \cdot D) \cdot (A+B) \cdot 1\}$
$\qquad +\{(A+B+1) \cdot (\bar{A} \cdot \bar{C} + \bar{C} \cdot \bar{D} + \bar{D} \cdot \bar{A}) \cdot (C \cdot D)\}$
$\qquad = \{A \cdot \bar{C} \cdot \bar{D} + A \cdot C \cdot D + \bar{A} \cdot B \cdot \bar{C} + \bar{A} \cdot B \cdot \bar{D} + B \cdot C \cdot D + B \cdot \bar{C} \cdot \bar{D}\} + \{0\}$
$\qquad = A \cdot \bar{C} \cdot \bar{D} + A \cdot C \cdot D + \bar{A} \cdot B \cdot (\bar{C}+\bar{D}) + \bar{A} \cdot B \cdot C \cdot D + A \cdot B \cdot C \cdot D + \bar{A} \cdot B \cdot \bar{C} \cdot \bar{D} + A \cdot B \cdot \bar{C} \cdot \bar{D}$
$\qquad = A \cdot \bar{C} \cdot \bar{D} + A \cdot C \cdot D + \bar{A} \cdot B \cdot (\bar{C}+\bar{D}+C \cdot D+\bar{C} \cdot \bar{D}) + A \cdot B \cdot C \cdot D + A \cdot B \cdot \bar{C} \cdot \bar{D}$
$\qquad = A \cdot \bar{C} \cdot \bar{D} + A \cdot C \cdot D + \bar{A} \cdot B$ $W_C = \bar{A} \cdot B + B \cdot C + C \cdot \bar{A}$
$X_C = A \cdot C$
$Y_C = B \cdot D$
$Z_C = R_L(0)$ $C_{NEXT} = \{(\bar{A} \cdot B + B \cdot C + C \cdot \bar{A} + A \cdot C) \cdot (\bar{B}+\bar{D}) \cdot 1\}$
$\qquad +\{(\bar{B}+\bar{D}+1) \cdot (\bar{A} \cdot B + B \cdot C + C \cdot \bar{A}) \cdot (A \cdot C)\}$
$\qquad = \{\bar{A} \cdot \bar{B} \cdot C + \bar{A} \cdot B \cdot \bar{D} + \bar{A} \cdot C \cdot \bar{D} + B \cdot C \cdot \bar{D} + A \cdot \bar{B} \cdot C + A \cdot C \cdot \bar{D}\} + \{A \cdot B \cdot C\}$
$\qquad = \{\bar{A} \cdot \bar{B} \cdot C + \bar{A} \cdot B \cdot \bar{D} + \bar{A} \cdot B \cdot C \cdot \bar{D} + \bar{A} \cdot B \cdot C \cdot \bar{D} + A \cdot B \cdot C \cdot \bar{D} + A \cdot \bar{B} \cdot C + A \cdot C \cdot \bar{D}\}$
$\qquad + \{A \cdot B \cdot C\}$
$\qquad = \bar{A} \cdot \bar{B} \cdot C + \bar{A} \cdot B \cdot \bar{D} + A \cdot C \cdot (B \cdot \bar{D} + \bar{B} + \bar{D} + B)$
$\qquad = \bar{A} \cdot \bar{B} \cdot C + \bar{A} \cdot B \cdot \bar{D} + A \cdot C$ $W_D = \bar{A} \cdot B + B \cdot C + C \cdot \bar{A}$
$X_D = \bar{B} + D$
$Y_D = \bar{A} + \bar{D}$
$Z_D = R_L(0)$ $D_{NEXT} = \{(\bar{A} \cdot B + B \cdot C + C \cdot \bar{A} + \bar{B} + D) \cdot (A \cdot D) \cdot 1\}$
$\qquad +\{(A \cdot D + 1) \cdot (\bar{A} \cdot B + B \cdot C + C \cdot \bar{A}) \cdot (\bar{B}+D)\}$
$\qquad = \{(B+C+\bar{B}+D) \cdot (A \cdot D) \cdot 1\} + \{\bar{A} \cdot \bar{B} \cdot C + \bar{A} \cdot B \cdot D + \bar{A} \cdot C \cdot D + B \cdot C \cdot D\}$
$\qquad = \{A \cdot D\} + \{\bar{A} \cdot \bar{B} \cdot C + \bar{A} \cdot B \cdot D + \bar{A} \cdot B \cdot C \cdot D + \bar{A} \cdot B \cdot C \cdot D + \bar{A} \cdot B \cdot C \cdot D + A \cdot B \cdot C \cdot D\}$
$\qquad = A \cdot D + \bar{A} \cdot \bar{B} \cdot C + \bar{A} \cdot B \cdot D$

FIG. 16C

| DCBA | D<sub>NEXT</sub> | C<sub>NEXT</sub> | B<sub>NEXT</sub> | A<sub>NEXT</sub> |
|------|------|------|------|------|
| 0000 | 0 | 0 | 0 | 1 |
| 0001 | 0 | 0 | 1 | 1 |
| 0011 | 0 | 0 | 1 | 0 |
| 0010 | 0 | 1 | 1 | 0 |
| 0110 | 0 | 1 | 1 | 1 |
| 0111 | 0 | 1 | 0 | 1 |
| 0101 | 0 | 1 | 0 | 0 |
| 0100 | 1 | 1 | 0 | 0 |
| 1100 | 1 | 1 | 0 | 1 |
| 1101 | 1 | 1 | 1 | 1 |
| 1111 | 1 | 1 | 1 | 0 |
| 1110 | 1 | 0 | 1 | 0 |
| 1010 | 1 | 0 | 1 | 1 |
| 1011 | 1 | 0 | 0 | 1 |
| 1001 | 1 | 0 | 0 | 0 |
| 1000 | 0 | 0 | 0 | 0 |

FIG. 17B

S/A OUT = $V_+ \cdot \overline{V_-}$ $A_{NEXT} = (\overline{A}+B) \cdot \overline{(A \cdot B)} = (\overline{A}+B) \cdot (\overline{A}+\overline{B}) = \overline{A}$ $B_{NEXT} = (A+B) \cdot \overline{(A \cdot B)} = (A+B) \cdot (\overline{A}+\overline{B}) = A \cdot \overline{B} + \overline{A} \cdot B = A \oplus B$ S/A OUT = $(W+X) \cdot \overline{Y} \cdot \overline{Z} + (\overline{Y}+\overline{Z}) \cdot W \cdot X$ $W_C = R_H(1)$ $X_C = A \cdot B + B \cdot C + C \cdot A$ $Y_C = A \cdot C$ $Z_C = B + \overline{C}$ $C_{NEXT} = (1 + A \cdot B + B \cdot C + C \cdot A) \cdot \overline{(A \cdot C)} \cdot \overline{(B+\overline{C})} + \{\overline{(A \cdot C)} + \overline{(B+\overline{C})}\} \cdot 1 \cdot (A \cdot B + B \cdot C + C \cdot A)$ $\quad = (1 + A \cdot B + B \cdot C + C \cdot A) \cdot (\overline{A}+\overline{C}) \cdot \overline{B} \cdot C + (\overline{A}+\overline{C}+\overline{B} \cdot C) \cdot (A \cdot B + B \cdot C + C \cdot A)$ $\quad = (1 + A \cdot B + B \cdot C + C \cdot A) \cdot \overline{A} \cdot \overline{B} \cdot C + \overline{A} \cdot B \cdot C + A \cdot B \cdot \overline{C} + A \cdot \overline{B} \cdot C$ $\quad = \overline{A} \cdot \overline{B} \cdot C + \overline{A} \cdot B \cdot C + A \cdot B \cdot \overline{C} + A \cdot \overline{B} \cdot C$ $\quad = A \cdot B \cdot \overline{C} + \overline{A} \cdot C + \overline{B} \cdot C$ $W_D = A \cdot B + B \cdot D + D \cdot A$ $X_D = \overline{B} \cdot \overline{C} + \overline{C} \cdot D + D \cdot \overline{B}$ $Y_D = A \cdot D$ $Z_D = \overline{C} \cdot \overline{D}$ $D_{NEXT} = \{(A \cdot B + B \cdot D + D \cdot A + \overline{B} \cdot \overline{C} + \overline{C} \cdot D + D \cdot \overline{B}) \cdot (\overline{A}+\overline{D}) \cdot (C+D)\}$ $\quad\quad + \{(\overline{A}+\overline{D}+C+D) \cdot (A \cdot B + B \cdot D + D \cdot A) \cdot (\overline{B} \cdot \overline{C} + \overline{C} \cdot D + D \cdot \overline{B})\}$ $\quad = \{(A \cdot B + \overline{C} + D) \cdot (\overline{A} \cdot C + \overline{A} \cdot D + C \cdot \overline{D})\}$ $\quad\quad + \{A \cdot B \cdot \overline{C} \cdot D + B \cdot \overline{C} \cdot D + A \cdot \overline{B} \cdot \overline{C} \cdot D + A \cdot \overline{C} \cdot D + A \cdot \overline{B} \cdot D\}$ $\quad = A \cdot B \cdot C \cdot \overline{D} + \overline{A} \cdot D + \overline{B} \cdot D + \overline{C} \cdot D$

FIG. 17C

| DCBA | D<sub>NEXT</sub> | C<sub>NEXT</sub> | B<sub>NEXT</sub> | A<sub>NEXT</sub> |
|------|------|------|------|------|
| 0000 | 0 | 0 | 0 | 1 |
| 0001 | 0 | 0 | 1 | 0 |
| 0010 | 0 | 0 | 1 | 1 |
| 0011 | 0 | 1 | 0 | 0 |
| 0100 | 0 | 1 | 0 | 1 |
| 0101 | 0 | 1 | 1 | 0 |
| 0110 | 0 | 1 | 1 | 1 |
| 0111 | 1 | 0 | 0 | 0 |
| 1000 | 1 | 0 | 0 | 1 |
| 1001 | 1 | 0 | 1 | 0 |
| 1010 | 1 | 0 | 1 | 1 |
| 1011 | 1 | 1 | 0 | 0 |
| 1100 | 1 | 1 | 0 | 1 |
| 1101 | 1 | 1 | 1 | 0 |
| 1110 | 1 | 1 | 1 | 1 |
| 1111 | 0 | 0 | 0 | 0 |

FIG. 18B

S/A OUT = $V_+ \cdot \overline{V_-}$ $A_{NEXT} = (\overline{A}+B) \cdot \overline{(A \cdot B)} = (\overline{A}+B) \cdot (\overline{A}+\overline{B}) = \overline{A}$ $B_{NEXT} = (\overline{A}+B) \cdot \overline{(\overline{A} \cdot B)} = (\overline{A}+B) \cdot (A+\overline{B}) = A \cdot B + \overline{A} \cdot \overline{B} = \overline{A \oplus B}$ S/A OUT = $(W+X) \cdot \overline{Y} \cdot \overline{Z} + (\overline{Y}+\overline{Z}) \cdot W \cdot X$ $W_C = B \cdot C$ $X_C = \overline{A} \cdot \overline{B} + \overline{B} \cdot C + C \cdot \overline{A}$ $Y_C = R_L(0)$ $Z_C = \overline{A} \cdot C$ $C_{NEXT} = (B \cdot C + \overline{A} \cdot \overline{B} + \overline{B} \cdot C + C \cdot \overline{A}) \cdot (1) \cdot \overline{(\overline{A} \cdot C)} + (1 + \overline{\overline{A} \cdot C}) \cdot B \cdot C \cdot (\overline{A} \cdot \overline{B} + \overline{B} \cdot C + C \cdot \overline{A})$ $= (B \cdot C + \overline{A} \cdot \overline{B} + \overline{B} \cdot C + C \cdot \overline{A}) \cdot (A + \overline{C}) + (1 + A + \overline{C}) \cdot B \cdot C \cdot (\overline{A} \cdot \overline{B} + \overline{B} \cdot C + C \cdot \overline{A})$ $= (A \cdot B \cdot C + A \cdot \overline{B} \cdot C + \overline{A} \cdot \overline{B} \cdot \overline{C}) + (B \cdot C + A \cdot B \cdot C) \cdot (\overline{A} \cdot \overline{B} + \overline{B} \cdot C + C \cdot \overline{A})$ $= A \cdot B \cdot C + A \cdot \overline{B} \cdot C + \overline{A} \cdot \overline{B} \cdot \overline{C} + \overline{A} \cdot B \cdot C$ $= \overline{A} \cdot \overline{B} \cdot \overline{C} + A \cdot C + B \cdot C$ $W_D = A \cdot B + B \cdot D + D \cdot A$ $X_D = \overline{A} \cdot \overline{C} + \overline{C} \cdot D + D \cdot \overline{A}$ $Y_D = \overline{C} \cdot D$ $Z_D = B \cdot \overline{D}$ $D_{NEXT} = \{(A \cdot B + B \cdot D + D \cdot A + \overline{A} \cdot \overline{C} + \overline{C} \cdot D + D \cdot \overline{A}) \cdot (C + \overline{D}) \cdot (\overline{B}+D)\}$
$\quad + \{(C + \overline{B} + D + \overline{D}) \cdot (A \cdot B + B \cdot D + D \cdot A) \cdot (\overline{A} \cdot \overline{C} + \overline{C} \cdot D + D \cdot \overline{A})\}$ $= \{(A \cdot B + \overline{A} \cdot \overline{C} + D) \cdot (C \cdot D + \overline{B} \cdot C + \overline{B} \cdot \overline{D})\}$
$\quad + \{A \cdot B \cdot \overline{C} \cdot D + \overline{A} \cdot B \cdot \overline{C} \cdot D + B \cdot \overline{C} \cdot D + \overline{A} \cdot B \cdot D + A \cdot \overline{C} \cdot D\}$ $= \overline{A} \cdot \overline{B} \cdot \overline{C} \cdot \overline{D} + A \cdot D + B \cdot D + C \cdot D$

FIG. 18C

| DCBA | D<sub>NEXT</sub> | C<sub>NEXT</sub> | B<sub>NEXT</sub> | A<sub>NEXT</sub> |
|---|---|---|---|---|
| 1111 | 1 | 1 | 1 | 0 |
| 1110 | 1 | 1 | 0 | 1 |
| 1101 | 1 | 1 | 0 | 0 |
| 1100 | 1 | 0 | 1 | 1 |
| 1011 | 1 | 0 | 1 | 0 |
| 1010 | 1 | 0 | 0 | 1 |
| 1001 | 1 | 0 | 0 | 0 |
| 1000 | 0 | 1 | 1 | 1 |
| 0111 | 0 | 1 | 1 | 0 |
| 0110 | 0 | 1 | 0 | 1 |
| 0101 | 0 | 1 | 0 | 0 |
| 0100 | 0 | 0 | 1 | 1 |
| 0011 | 0 | 0 | 1 | 0 |
| 0010 | 0 | 0 | 0 | 1 |
| 0001 | 0 | 0 | 0 | 0 |
| 0000 | 1 | 1 | 1 | 1 |

FIG. 22A

| | 2000_1 | 2000_2 | 2000_3 | 2000_4 | 2000_5 | 2000_6 | 2000_7 | 2000_8 |
|---|---|---|---|---|---|---|---|---|
| i(00) | ON | | | | | | | |
| i(01) | | ON | | | | | ON | ON |
| i(10) | | | | | | | | |
| i(11) | | | ON | ON | | ON | | |
| j(00) | | | ON | | ON | | | |
| j(01) | | | | ON | | | ON | |
| j(10) | ON | | | ON | | ON | | ON |
| j(11) | | ON | | | ON | ON | ON | |
| k(00) | | | | | | | | |
| k(01) | ON | | | | ON | | ON | ON |
| k(10) | | ON | | | | | | |
| k(11) | | | ON | | | | | |

FIG. 22B

|       | 2000_1 | 2000_2 | 2000_3 | 2000_4 | 2000_5 | 2000_6 | 2000_7 | 2000_8 |
|-------|--------|--------|--------|--------|--------|--------|--------|--------|
| i(00) |        |        |        |        |        |        |        |        |
| i(01) |        | ON     |        |        | ON     |        |        | ON     |
| i(10) |        |        | ON     | ON     |        | ON     | ON     |        |
| i(11) | ON     |        |        |        |        |        |        |        |
| j(00) |        |        |        |        | ON     |        |        |        |
| j(01) | ON     |        | ON     | ON     |        | ON     |        |        |
| j(10) | ON     | ON     | ON     |        |        |        | ON     | ON     |
| j(11) |        |        | ON     |        |        |        |        |        |
| k(00) | ON     |        |        | ON     | ON     |        |        |        |
| k(01) |        | ON     |        |        |        | ON     | ON     |        |
| k(10) |        |        |        |        |        |        |        |        |
| k(11) |        |        |        |        |        |        |        | ON     |

FIG. 22C

| | 2000_1 | 2000_2 | 2000_3 | 2000_4 | 2000_5 | 2000_6 | 2000_7 | 2000_8 |
|---|---|---|---|---|---|---|---|---|
| i(00) | | | | | | | | |
| i(01) | | ON | | | | | | |
| i(10) | ON | | | | | | | |
| i(11) | | | ON | | ON | | ON | ON |
| j(00) | | | | | | | | |
| j(01) | ON | | ON | ON | ON | ON | | |
| j(10) | ON | ON | | | | ON | ON | |
| j(11) | | | ON | ON | | ON | | |
| k(00) | ON | ON | | | ON | | | |
| k(01) | | | | | | | ON | |
| k(10) | | | | | | | | ON |
| k(11) | | | | | | | | |

SEMICONDUCTOR MEMORY DEVICE AND METHOD OF PROGRAMMING THE SAME

CROSS-REFERENCE TO RELATED APPLICATIONS

This application claims the benefit of Korean Patent Application No. 10-2007-0113875, filed on Nov. 18, 2007, in the Korean Intellectual Property Office, the disclosure of which is incorporated herein in its entirety by reference.

BACKGROUND

1. Field

One or more embodiments of the present invention relate to a semiconductor memory, and more particularly, to a semiconductor memory device which operates at a plurality of modes while varying the direction of a magnetically induced current flowing through a magnetic induction layer according to a logical combination of a plurality of input values, and a method of programming the same.

2. Description of the Related Art

A magnetic random access memory (RAM) has an operating speed higher than that of a static random access memory (SRAM), integration corresponding to that of a dynamic random access memory (DRAM), and nonvolatile memory characteristic corresponding to that of a flash memory. The magnetic RAM is a memory device that senses current variations according to magnetization directions of ferromagnetic thin films formed in a multi-layer structure, and reads and writes information using the current variations. The magnetic RAM has a high operating speed, low power consumption and high integration owing to characteristics of the ferromagnetic thin films and can perform a nonvolatile memory operation of a flash memory.

Magnetic RAMs use a giant magnetoresistive (GMR) phenomenon or a spin polarization magnetic permeation phenomenon which are generated because a spin largely affects the electron transfer phenomenon. Magnetic RAMs employing GMR use a difference between resistance when spin directions of two magnetic layers are identical to each other and resistance when the spin directions are different from each other. Magnetic RAMs employing the spin polarization magnetic permeation use the phenomenon that a case where spin directions of two magnetic layers are identical to each other has current permeation better than a case where the spin directions are different from each other.

SUMMARY

One or more embodiments of the present invention provides a semiconductor memory device which operates at a plurality of modes while varying the direction of a magnetically induced current flowing through a magnetic induction layer according to a logical combination of a plurality of input values.

One or more embodiments of the present invention also provides a method of programming a semiconductor memory device by which the semiconductor memory device can operate at a plurality of modes, the semiconductor memory device varying the direction of a magnetically induced current flowing through a magnetic induction layer according to a logical combination of a plurality of input values.

Additional aspects and/or advantages will be set forth in part in the description which follows and, in part, will be apparent from the description, or may be learned by practice of the invention.

According to an aspect of the present invention, there is provided a semiconductor memory device comprising a mode input value generating unit to change a connection state between input values of a current driving circuit so as to correspond to each of at least two operating modes, and to define a logic function of a magnetic memory cell connected to the current driving circuit, in response to each operating mode; and a logic operating unit to perform a logic operation on the logic functions of at least two magnetic memory cells defined according to each of the operating modes and to generate a result of logic operation.

According to another aspect of the present invention, there is provided a method of programming a semiconductor memory device comprising changing a connection state between input values of a current driving circuit so as to correspond to each of at least two operating modes, and defining a logic function of a magnetic memory cell connected to the current driving circuit, in response to each operating mode; and performing a logic operation on the logic functions of at least two magnetic memory cells defined according to each of the operating modes and generating a result of logic operation.

BRIEF DESCRIPTION OF THE DRAWINGS

These and/or other aspects and advantages will become apparent and more readily appreciated from the following description of the embodiments, taken in conjunction with the accompanying drawings of which:

FIGS. 3A through 3E are diagrams for explaining the semiconductor memory device illustrated in FIG. 2 according to an embodiment of the present invention;

FIGS. 11A and 11B are diagrams for explaining an XNOR logic circuit constructed using the semiconductor memory device illustrated in FIG. 3a and the sense amplifier illustrated in FIG. 9a;

FIGS. 12A, 12B and 12C are diagrams for explaining a logic circuit constructed using four resistance-variable elements the sense amplifier;

FIGS. 13A, 13B and 13C are diagrams for explaining a 3-bit gray counter according to an embodiment of the present invention;

FIGS. 14A, 14B and 14C are diagrams for explaining a 3-bit up-counter according to an embodiment of the present invention;

FIGS. 15A, 15B and 15C are diagrams for explaining a 3-bit down-counter according to an embodiment of the present invention;

FIGS. 16A, 16B and 16C are diagrams for explaining a 4-bit gray counter according to an embodiment of the present invention;

FIGS. 17A, 17B and 17C are diagrams for explaining a 4-bit up-counter according to an embodiment of the present invention;

FIGS. 18A, 18B and 18C are diagrams for explaining a 4-bit down-counter according to an embodiment of the present invention;

FIGS. 22A, 22B and 22C are tables for explaining states of a control signal which is provided to each transistor used as a switch corresponding to a counting mode, according to an embodiment of the present invention.

DETAILED DESCRIPTION OF THE EMBODIMENTS

Figures 1A, 1B:
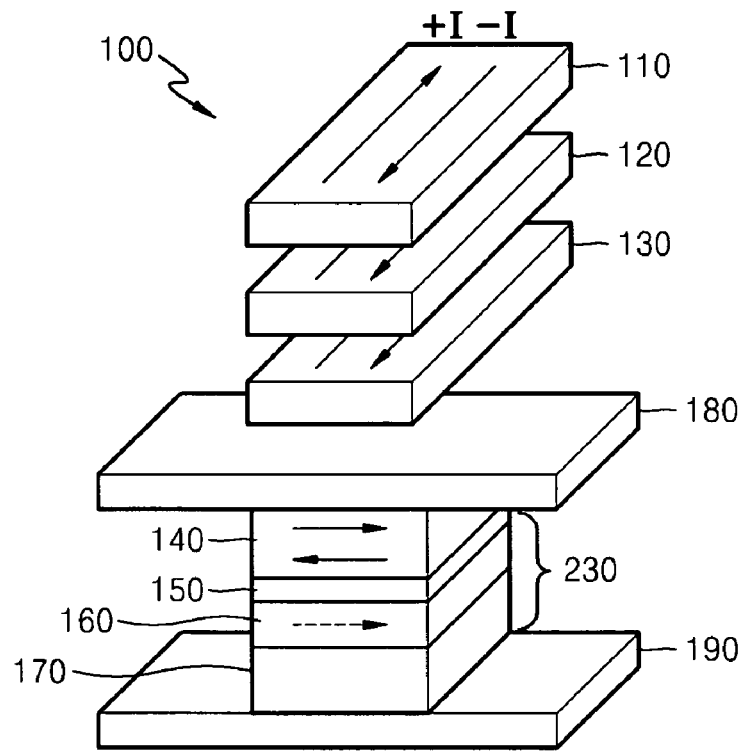
FIGS. 1A and 1B illustrate a semiconductor memory device including three magnetic induction layers according to a comparative example.

Reference will now be made in detail to embodiments, examples of which are illustrated in the accompanying drawings, wherein like reference numerals refer to the like elements throughout. In this regard, embodiments of the present invention may be embodied in many different forms and should not be construed as being limited to embodiments set forth herein. Accordingly, embodiments are merely described below, by referring to the figures, to explain aspects of the present invention.

FIGS. 1A and 1B illustrate a semiconductor memory device including three magnetic induction layers according to a comparative example. Referring to FIG. 1A, the semiconductor memory device 100 includes as many as magnetic induction layers 110, 120 and 130 as the number of input values and a resistance-variable element 230. The resistance-variable element 230 includes a free magnetic layer 140 and a fixed magnetic layer 160. The reference number 150 denotes an insulating layer and the reference numbers 180 and 190 denote a pair of resistance measurement lines. The reference number 170 denotes a pinning layer which securely fixes the magnetization direction of the fixed magnetic layer 160 using an anti-ferromagnetic material.

In the semiconductor memory device 100, the direction of a magnetically induced current flowing through a single magnetic induction layer is determined according to a single input value. That is, magnetically induced currents respectively flow through the magnetic induction layers 110, 120 and 130 in different directions according to logic states of the input values. For example, a magnetically induced current flows in a +I direction in the magnetic induction layer 110 when an input value input to through the bottom of the magnetic induction layer 110 is 1 and the magnetically induced current flows in a −I direction in the magnetic induction layer 110 when the input value is 0.

Referring to the table illustrated in FIG. 1B, when at least two input values are 0 and thus at least two magnetically induced currents flow in the −I direction, the free magnetic layer 140 is magnetized to the right so as to reduce the resistance of the resistance-variable element 230. On the other hand, when at least two input values are 1 and thus at least two magnetically induced currents flow in the +I direction, the free magnetic layer 140 is magnetized to the left so as to increase the resistance of the resistance-variable element 230. For example, when the input values are 0, 0 and 1, the magnetically induced current flows in the −I direction in the magnetic induction layers 110 and 120 and flows in the +I direction in the magnetic induction layer 130. Accordingly, the free magnetic layer 140 is magnetized to the right, and thus the resistance of the resistance-variable element 230 decreases.

However, the semiconductor memory device 100 according to a comparative example has as many magnetic induction layers as the number of input values. For example, the semiconductor memory device 100 must include the three magnetic induction layers 110, 120 and 130 in order to process the three input values. Accordingly, a complicated process is required to manufacture the semiconductor memory device 100. Furthermore, the semiconductor memory device 100 has as many current driving circuits for flowing the magnetically induced current through the plurality of magnetic induction layers as the number of magnetic induction layers. Moreover, since the top magnetic induction layer 110 is distant from the free magnetic layer 140, the magnetic induction layer 110 requires a high current to change the magnetization direction of the free magnetic layer 140.

Figure 2:
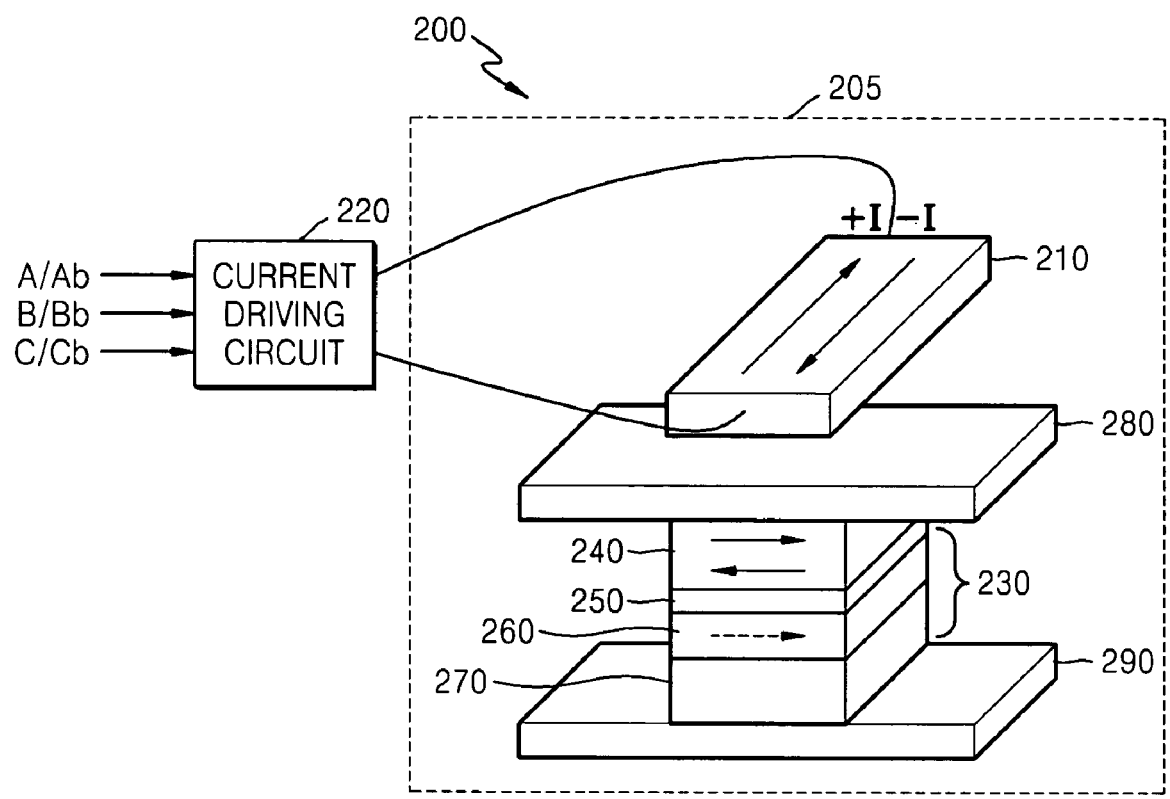
FIG. 2 illustrates a semiconductor memory device including a single magnetic induction layer according to an embodiment of the present invention.

FIG. 2 illustrates a semiconductor memory device including a single magnetic induction layer according to an embodiment of the present invention. Referring to FIG. 2, the semiconductor memory device 200 includes a current driving circuit 220 and a magnetic memory cell 205. The magnetic memory cell 205 includes a magnetic induction layer 210 and a resistance-variable element 230. The resistance-variable element 230 may comprise a metal line. The resistance-variable element 230 may comprise a free magnetic layer 240 and a fixed magnetic layer 260. The resistance-variable element 230 may further comprise an insulating layer disposed between the free magnetic layer 240 and the fixed magnetic layer 260. The magnetic memory cell 205 may further include a pair of resistance measurement lines 280 and 290 for measuring the resistance of the resistance-variable element 230.

The current driving circuit 220 receives a plurality of input values A, B and C and changes the direction (+I or −I) of a magnetically induced current flowing through the magnetic induction layer 210, according to a logical combination of the input values A, B and C. The logical combination of the three input values A, B and C can correspond to the logical sum of the logical product of the first and second input values A and B, the logical product of the second and third input values B and C, and the logical product of the third and first input values C and A, that is, (A*B)+(B*C)+(C*A).

The magnetic induction layer 210 induces magnetism in a direction varying according to the direction (+I or −I) of the magnetically induced current. The resistance-variable element 230 has a resistance varying according to the direction of the magnetism induced by the magnetic induction layer 210. Accordingly, the semiconductor memory device 200 according to an embodiment of the present invention does not require to have as many magnetic induction layers as the number of input values. Particularly, the semiconductor memory device 200 according to an embodiment of the present invention can represent a logical combination of the plurality of input values A, B and C using only a single magnetic induction layer 210. The number of the magnetic induction layer 210 can be smaller than the number of input values A, B and C. Preferably, the number of magnetic induction layer 210 is one.

The resistance-variable element 230 has a different resistance according to the direction of magnetism induced in the magnetic induction layer 210. The free magnetic layer 240 has magnetism in a direction varying according to the direction of the magnetically induced current and the fixed magnetic layer 260 has magnetism in a fixed direction irrespective of the direction of the magnetically induced current. The resistance of the resistance-variable element 230 is determined according to the magnetic directions of the free magnetic layer 240 and the fixed magnetic layer 260. The resistance of the resistance-variable element 230 varying according to a logic combination of input values is measured using a pair of resistance measurement lines 280 and 290.

Referring back to FIG. 2, the current driving circuit 220 receives the three input values A, B and C and changes the direction (+I or −I) of the magnetically induced current according to a logical combination of the received input values A, B and C. While FIG. 2 illustrates that the current driving circuit 220 changes the direction (+I or −I) of the magnetically induced current according to a logical combination of three input values, the number of input values is not limited to 3. For example, the current driving circuit 220 can receive two input values and change the direction of the magnetically induced current according to a logical combination of the two input values.

FIGS. 3A through 3E illustrate an example of the semiconductor memory device of FIG. 2 according to an embodiment of the present invention. The semiconductor memory device includes a current driving circuit 220, a magnetic induction layer 210 and a resistance-variable element 230.

Figure 3A:
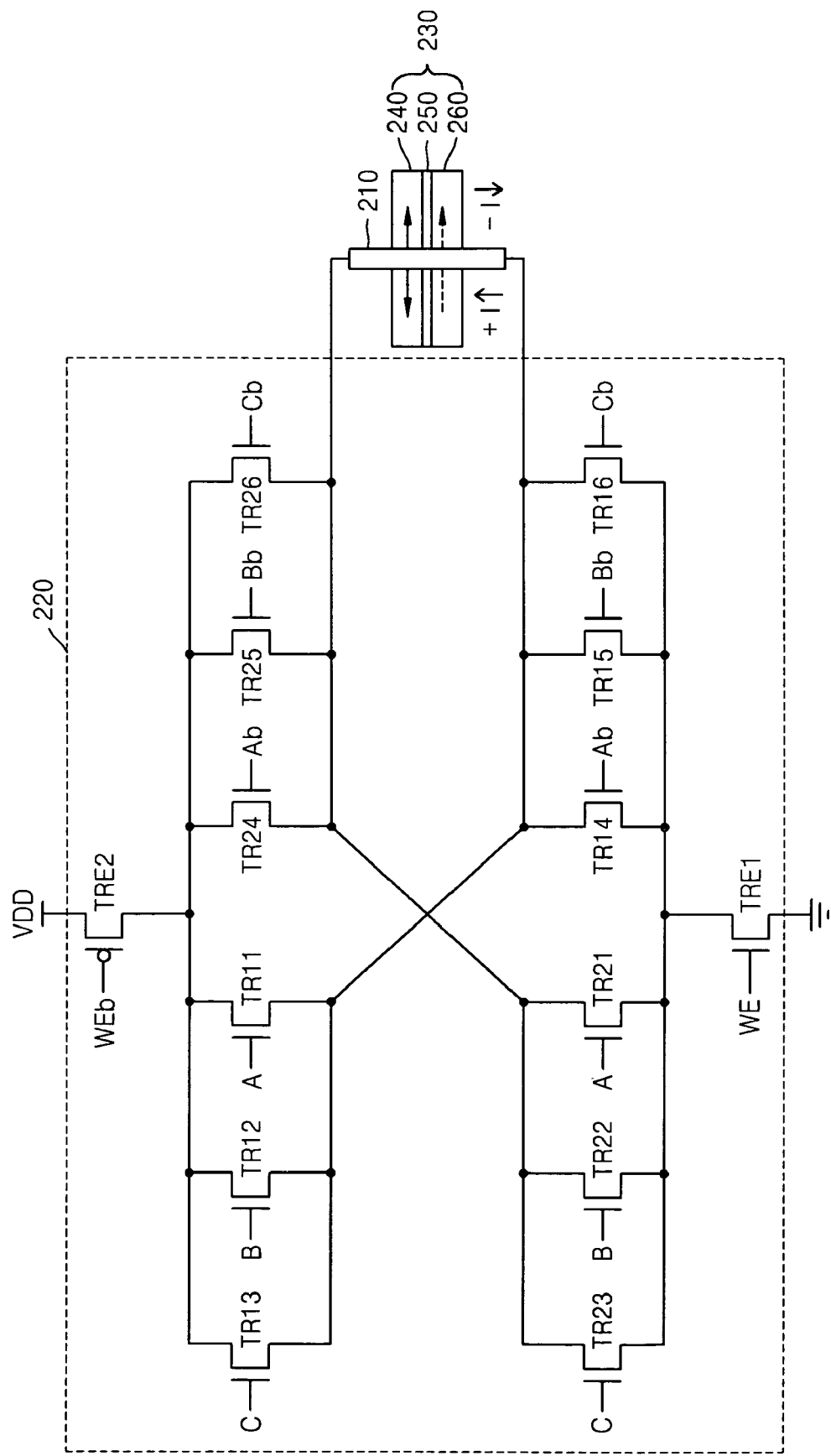

Referring to FIG. 3A, the current driving circuit 220 can include a plurality of transistors TR11 through TR16, TR21 through TR26, TRE1 and TRE2, which are turned on or turned off in response to the plurality of input values A, B and C or a plurality of inverted input values Ab, Bb and Cb. It is assumed that the same current I flows through the transistors TR11 through TR16 and TR21 through TR26 when the transistors TR11 through TR16 and TR21 through TR26 are tuned on. The transistors TRE1 and TRE2 enable the current driving circuit 220 in response to enable signals WE and WEb.

The operation of the semiconductor memory device illustrated in FIG. 3A will now be explained. The current driving circuit 220 generates a current having a magnitude and a direction which vary according to the plurality of input values A, B and C. The generated current flows through the magnetic induction layer 210 and the resistance of the resistance-variable element 230 is determined by the direction of the current flowing through the magnetic induction layer 210.

For example, when the input values A, B and C are respectively 0, 0 and 0, the transistors TR11 and TR21 receiving the input value A, the transistors TR12 and TR22 receiving the input value B, and the transistors TR13 and TR23 receiving the input value C are turned off and the transistors TR14 and TR24 receiving the inverted input value Ab, the transistors TR15 and TR25 receiving the inverted input value Bb, and the transistors TR16 and TR26 receiving the inverted input value Cb are turned on. In this case, a current path is formed from a power supply voltage VDD to a ground voltage via the transistors TR24, TR25 and TR26, the magnetic induction layer 210 and the transistors TR14, TR15 and TR16. That is, the magnetic induction layer 210 receives a current from the transistors TR24, TR25 and TR26 and provides the current to the transistors TR14, TR15 and TR16. In this case, a current 3I flows through the current path. That is, when the input values A, B and C are respectively 0, 0 and 0, the current 3I flows in a −I direction through the magnetic induction layer 210. Accordingly, the resistance-variable element 230 has a low resistance.

When the input values A, B and C are respectively 0, 1 and 1, the transistors TR11 and TR21 receiving the input value A, the transistors TR15 and TR25 receiving the inverted input value Bb, and the transistors TR16 and TR26 receiving the inverted input value Cb are turned off and the transistors TR12 and TR22 receiving the input value B, the transistors TR13 and TR23 receiving the input value C, and the transistors TR14 and TR24 receiving the inverted input value Ab are turned on. In this case, a current 2I flows from the power supply voltage VDD through the two transistors TR12 and TR13. The current 2I is divided and respectively flows through the turned-on transistor TR14 and the magnetic induction layer 210. That is, a current I flows through the magnetic induction layer 210 in a +I direction. In addition, a current I flows from the power supply voltage VDD through the transistor TR24. The current I flowing through the transistor TR24 is added to the current I flowing in the +I direction through the magnetic induction layer 210 to form a current 2I. The current 2I is divided by two and a current I respectively flows through the transistors TR22 and TR23. That is, when the input values A, B and C are respectively 0, 1 and 1, the current I flows in the +I direction through the magnetic induction layer 210, and thus the resistance-variable element 230 has a high resistance.

FIG. 3B illustrates resistances according to logical combinations of the input values of the semiconductor memory device of FIG. 3A. Referring to FIG. 3B, when the input values A, B and C are respectively 0, 1 and 0, a current −I flows through the magnetic induction layer 210 and the resistance-variable element 230 has a low resistance. When the input values A, B and C are respectively 1, 0, 1, a current +I flows through the magnetic induction layer 210 and the resistance-variable element 230 has a high resistance.

FIGS. 3C and 3D model an operation of determining the magnitude and the direction of the current flowing through the magnetic induction layer 210 according to the input values A, B and C in the semiconductor memory device of FIG. 3A. FIG. 3C illustrates that the input values A, B and C are input through the bottom of the magnetic induction layer 210. Referring to FIG. 3C, a current +I flows through the magnetic induction layer 210 when the input value, for example, A is 1 and a current −I flows through the magnetic induction layer 210 when the input value A is 0. FIG. 3D illustrates that the input values A, B and C are input through the top of the magnetic induction layer 210. Referring to FIG. 3D, a current −I flows through the magnetic induction layer 210 when the input value, for example, A is 1 and a current +I flows through the magnetic induction layer 210 when the input value A is 0. The operation illustrated in FIG. 3D can be achieved by supplying the inverted input value Ab instead of the input value A to the transistors TR11 and TR12 illustrated in FIG. 3A, supplying the inverted input value Bb instead of the input value B to the transistors TR12 and TR22 illustrated in FIG. 3A, supplying the inverted input value Cb instead of the input value C to the transistors TR13 and TR23 illustrated in FIG. 3A, applying the input value A instead of the inverted input value Ab to the transistors TR14 and TR24 illustrated in FIG. 3A, applying the input value B instead of the inverted input value Bb to the transistors TR15 and TR25 illustrated in FIG. 3A, and applying the input value C instead of the inverted input value Cb to the transistors TR16 and TR26 illustrated in FIG. 3A.

Figure 3E:
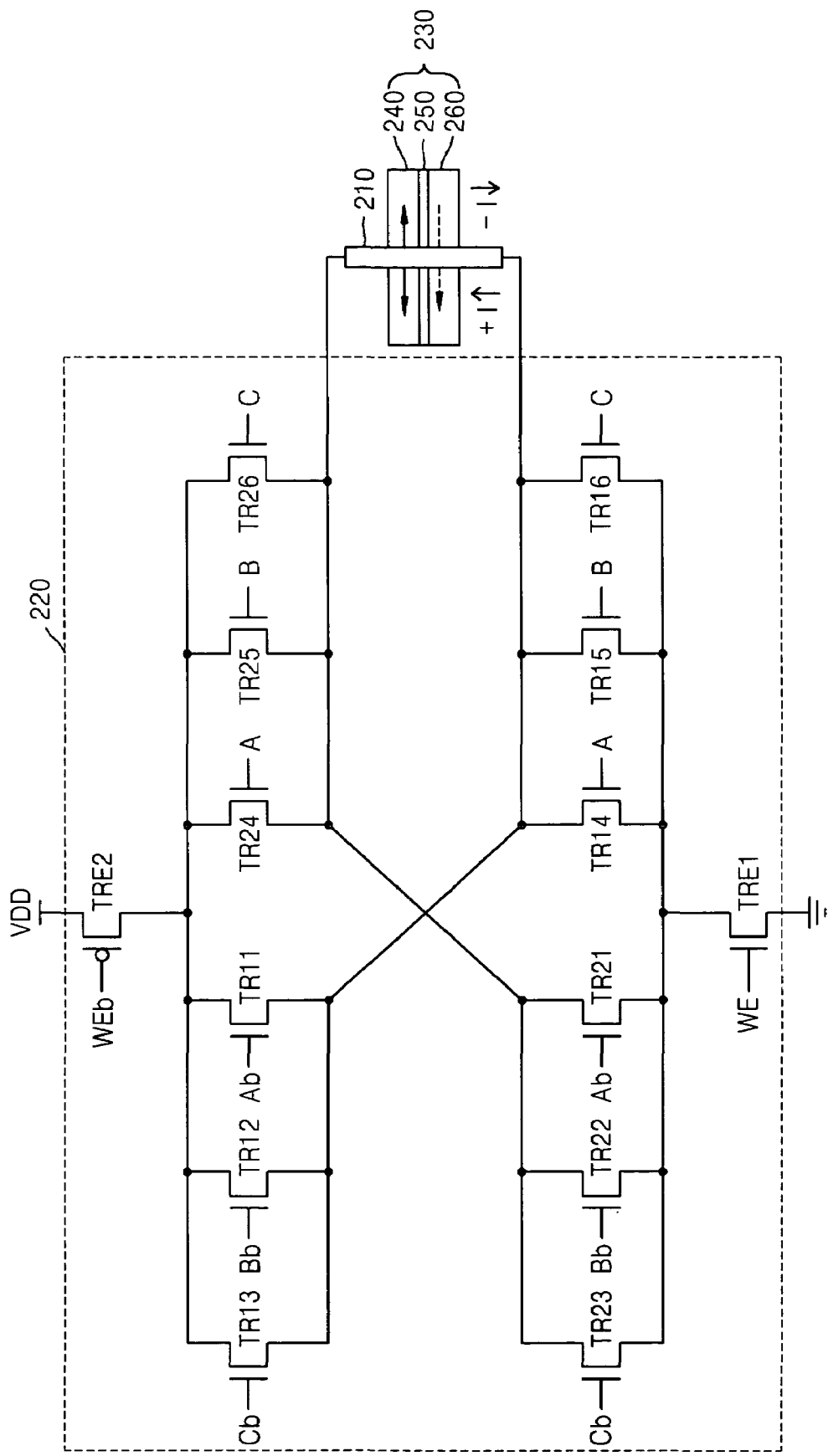

FIG. 3E illustrates a modified example of the semiconductor memory device illustrated in FIG. 3A according to another embodiment of the present invention. The semiconductor memory device illustrated in FIG. 3E includes the fixed magnetic layer 260 magnetized to the left. The inverted input value Ab is supplied to the transistors TR11 and TR21, the inverted input value Bb is supplied to the transistors TR12 and TR22, and the inverted input value Cb is applied to the transistors TR13 and TR23. In addition, the input value A is supplied to the transistors TR14 and TR24, the input value B is applied to the transistors TR15 and TR25, and the input value C is supplied to the transistors TR16 and TR26.

The semiconductor memory device illustrated in FIG. 3E performs the same logical operation as that of the semiconductor memory device illustrated in FIG. 3A by changing the magnetic direction of the fixed magnetic layer 260 and input values of transistors included in the current driving circuit 220. Specifically, in the semiconductor memory device illustrated in FIG. 3E, a current −I flows in the magnetic induction layer 210 and the resistance-variable element 230 has a high resistance when at least two of the input values A, B and C are 1, and a current +I flows in the magnetic induction layer 210 and the resistance-variable element 230 has a low resistance when at least two of the input values A, B and C are 0. In the semiconductor memory device illustrated in FIG. 3A, the current +I flows in the magnetic induction layer 210 and the resistance-variable element 230 has a high resistance when at least two of the input values A, B and C are 1, and the current −I flows in the magnetic induction layer 210 and the resistance-variable element 230 has a low resistance when at least two of the input values A, B and C are 0.

That is, in both the semiconductor memory device illustrated in FIG. 3E and the semiconductor memory device illustrated in FIG. 3A, the resistance-variable element 230 has a high resistance when at least two of the input values A, B and C are 1 and has a low resistance when at least two of the input values A, B and C are 0. Accordingly, the semiconductor memory device illustrated in FIG. 3E and the semiconductor memory device illustrated in FIG. 3A perform the same logical operation by changing the transistors receiving the input values A, B and C and the transistors receiving the inverted input values Ab, Bb and Cb.

That is, the semiconductor memory device according to an embodiment of the present invention can perform the same logical operation when the fixed magnetic layer is magnetized to the left and when the fixed magnetic layer is magnetized to the right through a simple circuit modification. Accordingly, the semiconductor memory device according to an embodiment of the present invention will be explained on the basis of the case in which the fixed magnetic layer is magnetized to the right, and the explanation for the case in which the fixed magnetic layer is magnetized to the left will be omitted. However, those of ordinary skill in the art can realize a semiconductor memory device having a fixed magnetic layer magnetized to the left with reference to a semiconductor memory device having a fixed magnetic layer magnetized to the right.

Figure 4A:
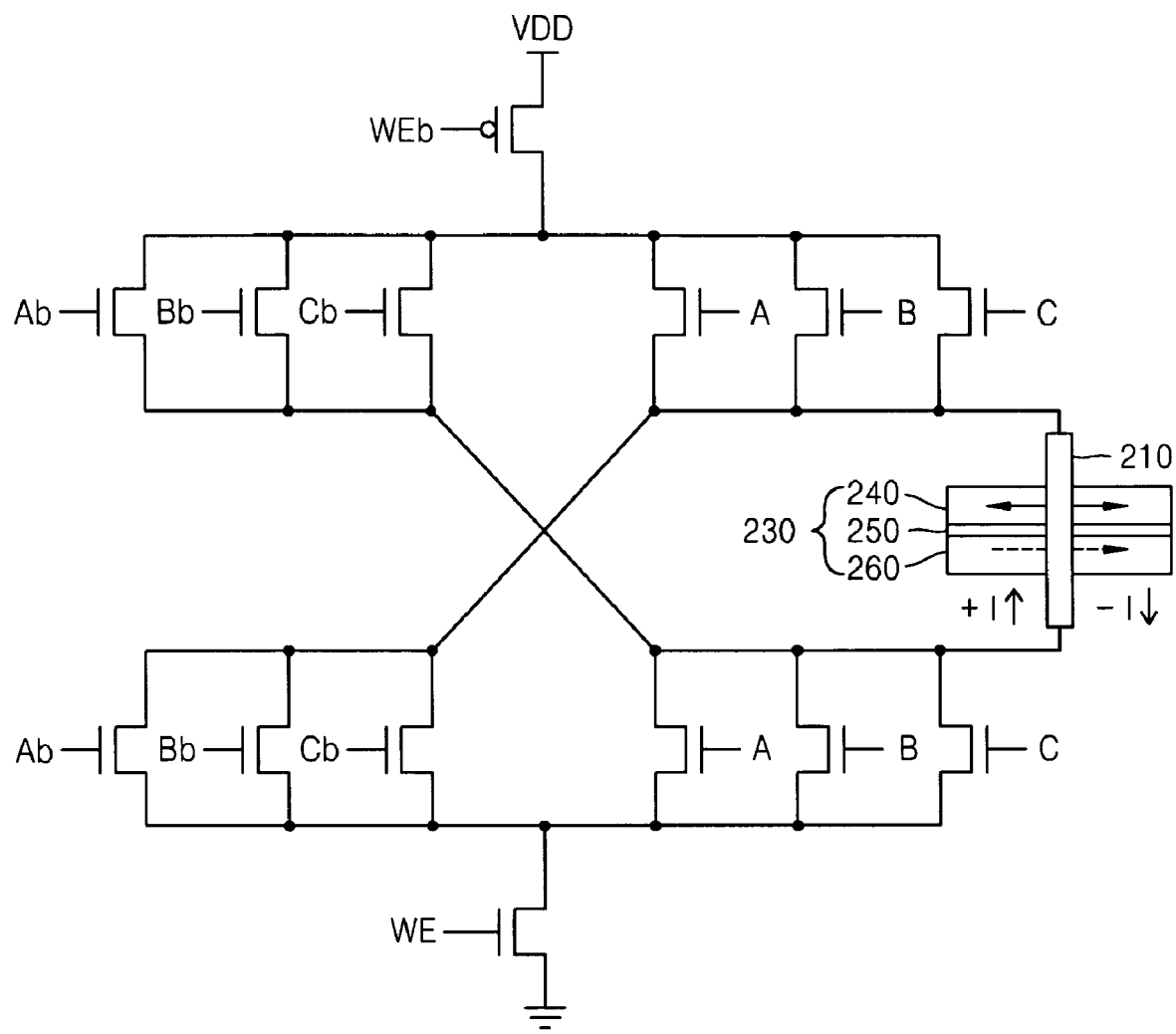
FIGS. 4A, 4B and 4C are diagrams for explaining the semiconductor memory device illustrated in FIG. 2 according to another embodiment of the present invention.
Figures 4B, 4C:
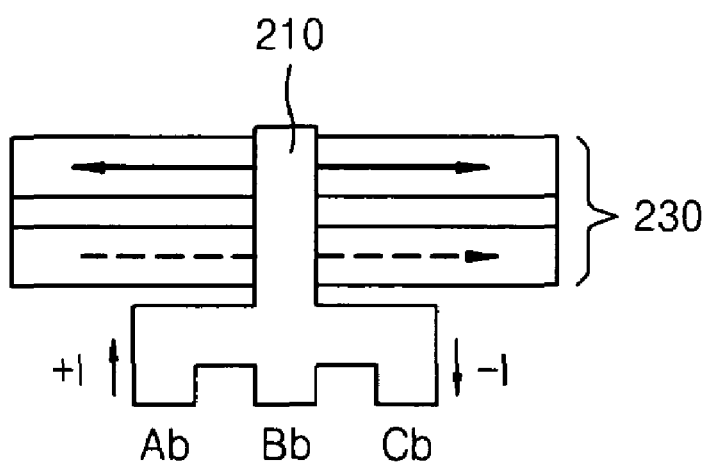

FIG. 4A illustrates a configuration of the semiconductor memory device of FIG. 2 according to another embodiment of the present invention, FIG. 4B illustrates resistances according to logical combinations of input values of the semiconductor memory device of FIG. 4A, and FIG. 4C models an operation of determining the magnitude and the direction of a current flowing in a magnetic induction layer 210 according to the input values in the semiconductor memory device illustrated in FIG. 4A. The structure and the operation of the semiconductor memory device illustrated in FIG. 4A correspond to those of the semiconductor memory device illustrated in FIG. 3A except that the input values input to the transistors are changed. Accordingly, detailed explanations of the semiconductor memory device illustrated in FIGS. 4A through 4C are omitted.

The current driving circuit 220 of the semiconductor memory device according to an embodiment of the present invention can fix one of the three input values and receive the remaining two input values. In this case, the current driving circuit 220 can change the direction of a magnetically induced current according to a logical combination of the fixed input value and the received two input values. In this manner, the semiconductor memory device according to an embodiment of the present invention can be used as various logic gates including an AND gate, an OR gate, a NAND gate and a NOR gate.

Figure 5A:
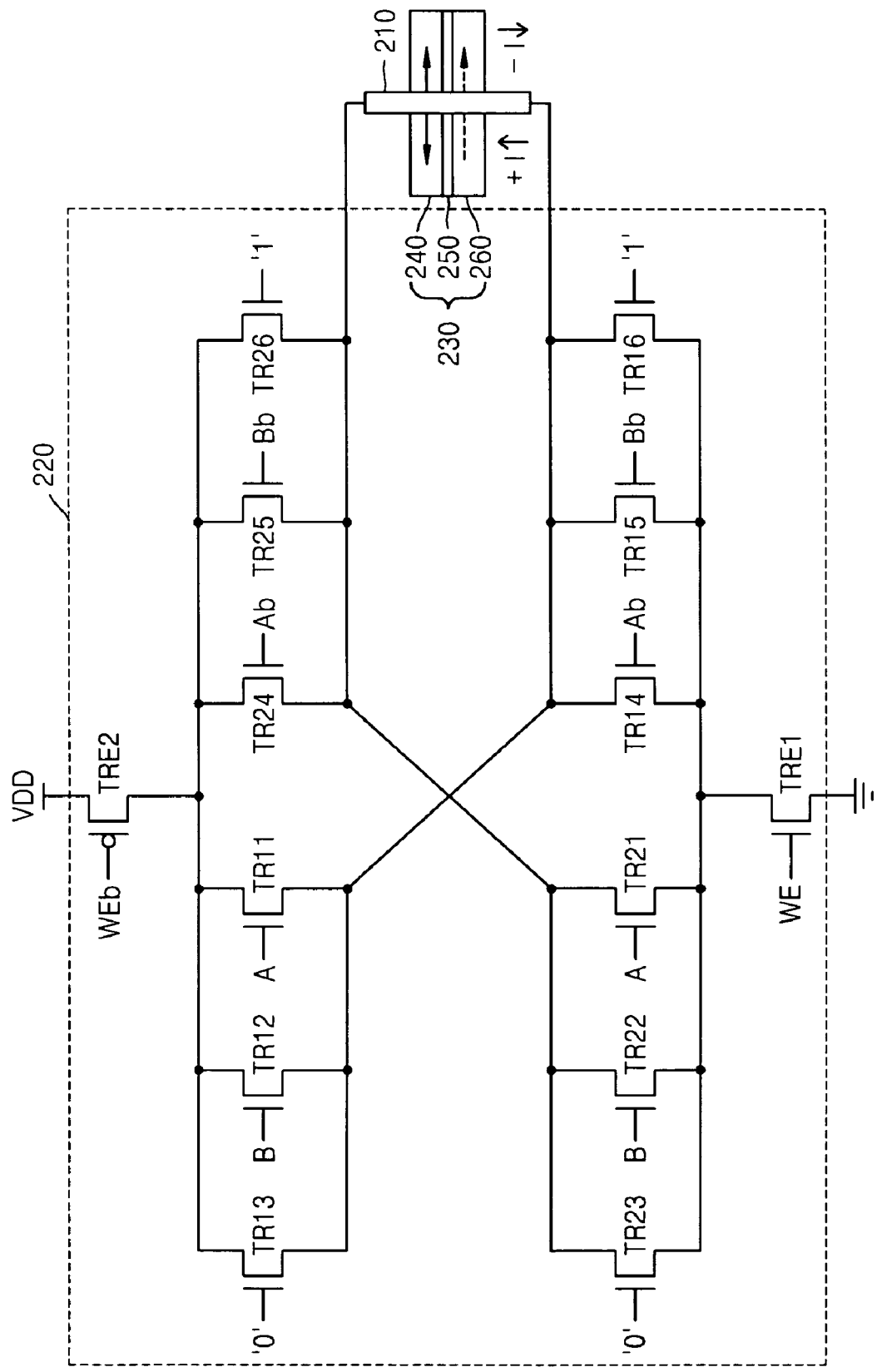
FIGS. 5A, 5B and 5C are diagrams for explaining the semiconductor memory device illustrated in FIG. 3A when used as an AND gate according to an embodiment of the present invention.

FIG. 5A illustrates the semiconductor memory device of FIG. 3A when used as an AND gate according to an embodiment of the present invention. Referring to FIG. 5A, 0 is input to the transistors TR13 and TR23 and 1 is input to the transistors TR16 and TR26. That is, the current driving circuit 220 fixes the input value C from among the three input values A, B and C to 0 or 1 and receives the remaining two input values A and B. In FIG. 5A, the input value C is fixed to 0. Accordingly, the transistors TR13 and TR23 receiving the input value C fixed to 0 are turned off and the transistors TR16 and TR26 receiving the input value Cb fixed to 1 are turned on. A magnetically induced current −I flows in the magnetic induction layer 210 according to the fixed input value C.

Figures 5B, 5C:
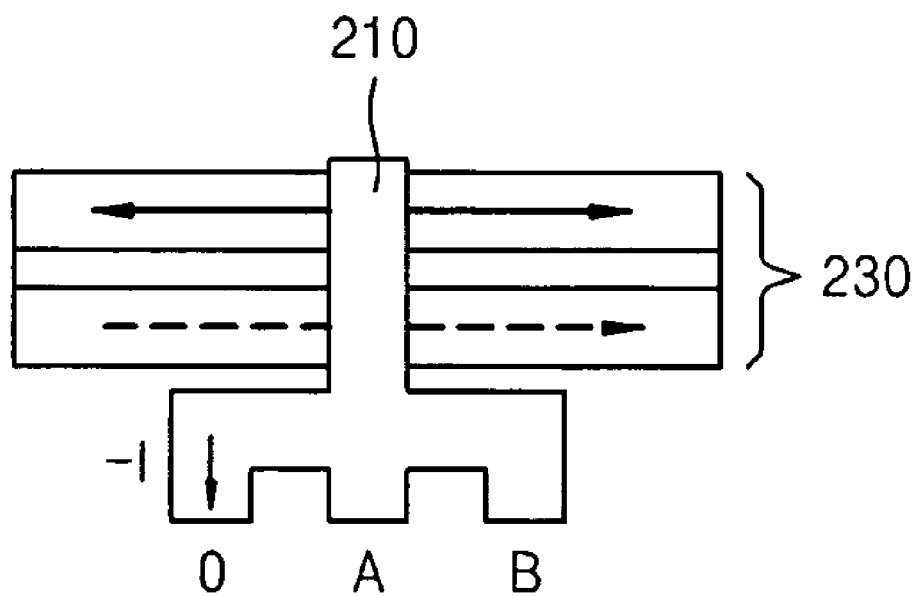

FIG. 5B illustrates resistances according to logical combinations of the input values A and B in the semiconductor memory device illustrated in FIG. 5A. When the input values A and B are both 1, a magnetically induced current +I flows in the magnetic induction layer 210, and thus the free magnetic layer 240 of the resistance-variable element 230 is magnetized to the left. In this case, the free magnetic layer 240 and the fixed magnetic layer 260 of the resistance-variable element 230 have different magnetic directions and the resistance of the resistance-variable element 230 increases. When the input values A and B are respectively 0 and 0, 0 and 1, or 1 and 0, a magnetically induced current −I flows in the magnetic induction layer 210, and thus the free magnetic layer 240 of the resistance-variable element 230 is magnetized to the right. In this case, the free magnetic layer 240 and the fixed magnetic layer 260 of the resistance-variable element 230 have the same magnetic direction and the resistance of the resistance-variable element 230 decreases. That is, the resistance of the resistance-variable element 230 increases when both the input values A and B are 1 and the resistance of the resistance-variable element 230 decreases when both the input value A and B are not 1. In this manner, the semiconductor memory device illustrated in FIG. 5A operates as an AND gate.

FIG. 5C models an operation of determining the magnitude and the direction of a current flowing in the magnetic induction layer 210 according to the input values in the semiconductor memory device of FIG. 5A. Referring to FIG. 5C, the input value C is fixed to 0, and thus a current −I flows through the magnetic induction layer 210. The direction of the current flowing in the magnetic induction layer 210 varies according to the input values A and B.

Figure 6A:
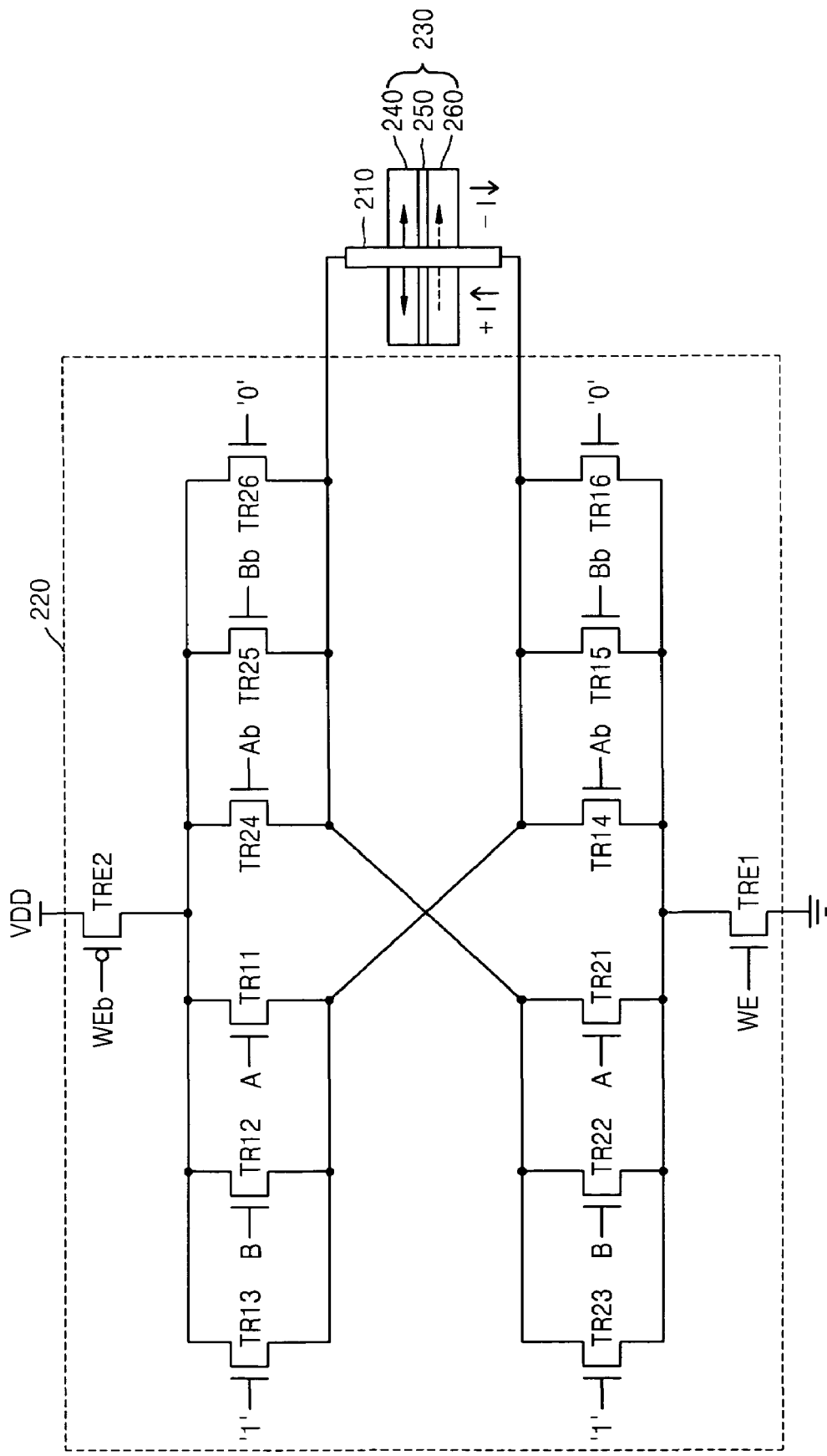
FIGS. 6A, 6B and 6C are diagrams for explaining the semiconductor memory device illustrated in FIG. 3A when used as an OR gate according to an embodiment of the present invention.

FIG. 6A illustrates the semiconductor memory device of FIG. 3A when used as an OR gate according to an embodiment of the present invention. Referring to FIG. 6A, 0 is input to the transistors TR16 and TR26 and 1 is input to the transistors TR13 and TR23. Accordingly, the transistors TR16 and TR26 are turned off irrespective of the input values A and B and the transistors TR13 and TR23 are turned on irrespective of the input values A and B.

Figures 6B, 6C:
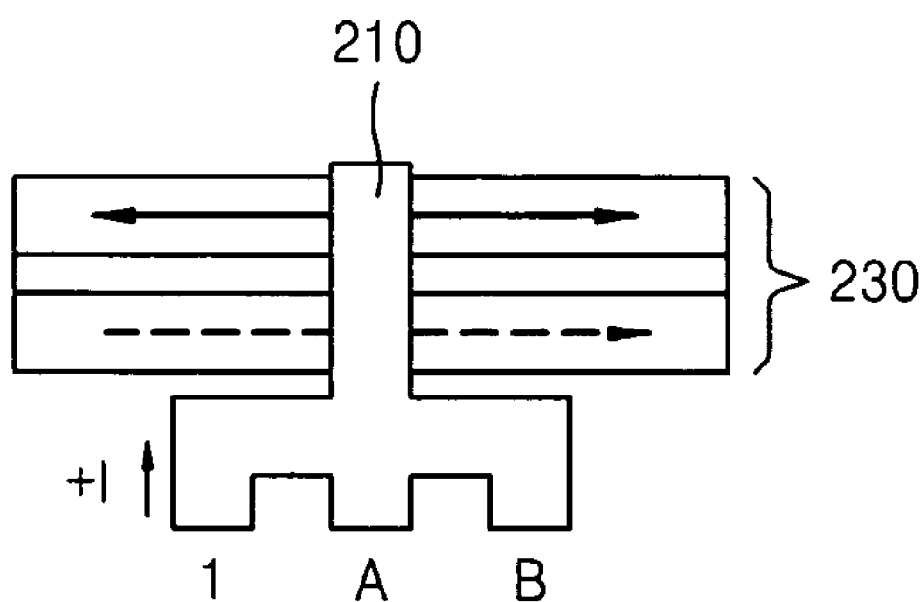

FIG. 6B illustrates resistances according to logical combinations of the input values A and B in the semiconductor memory device of FIG. 6A. The resistance of the resistance-variable element 230 decreases when the input values A and B are both 0 and increases when both the input values A and B are not 0. In this manner, the semiconductor memory device illustrated in FIG. 6A operates as an OR gate.

FIG. 6C models an operation of determining the magnitude and the direction of a current flowing in the magnetic induction layer 210 according to the input values in the semiconductor memory device of FIG. 6A.

Figure 7A:
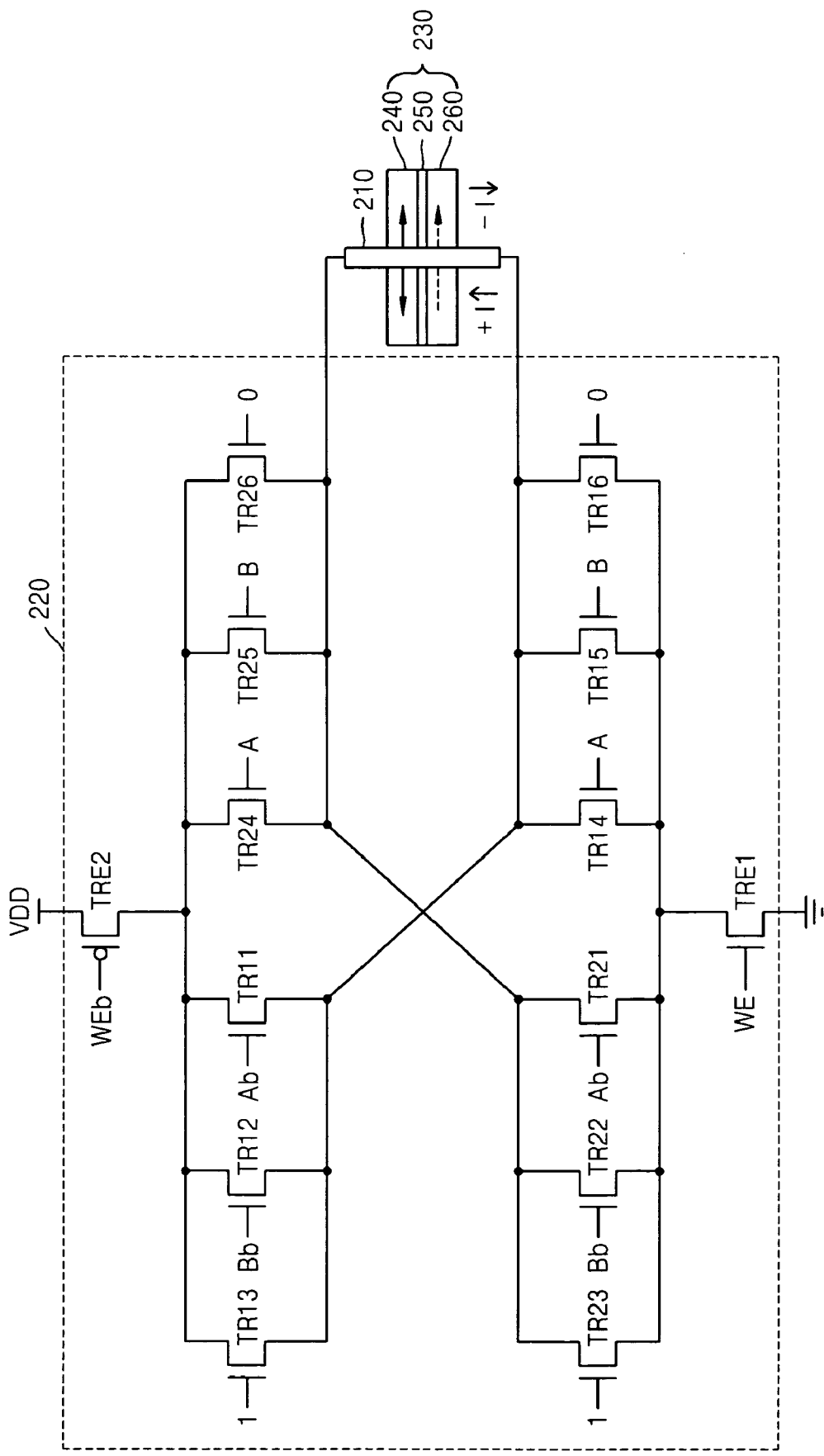
FIGS. 7A, 7B and 7C are diagrams for explaining the semiconductor memory device illustrated in FIG. 3A when used as a NAND gate according to an embodiment of the present invention.

FIG. 7A illustrates the semiconductor memory device of FIG. 3A when used as a NAND gate according to an embodiment of the present invention. Referring to FIG. 7A, 0 is input to the transistors TR16 and TR26 and 1 is input to the transistors TR13 and TR23. Accordingly, the transistors TR16 and TR26 are turned off irrespective of the input values A and B and the transistors TR13 and TR23 are turned on irrespective of the input values A and B.

Figures 7B, 7C:
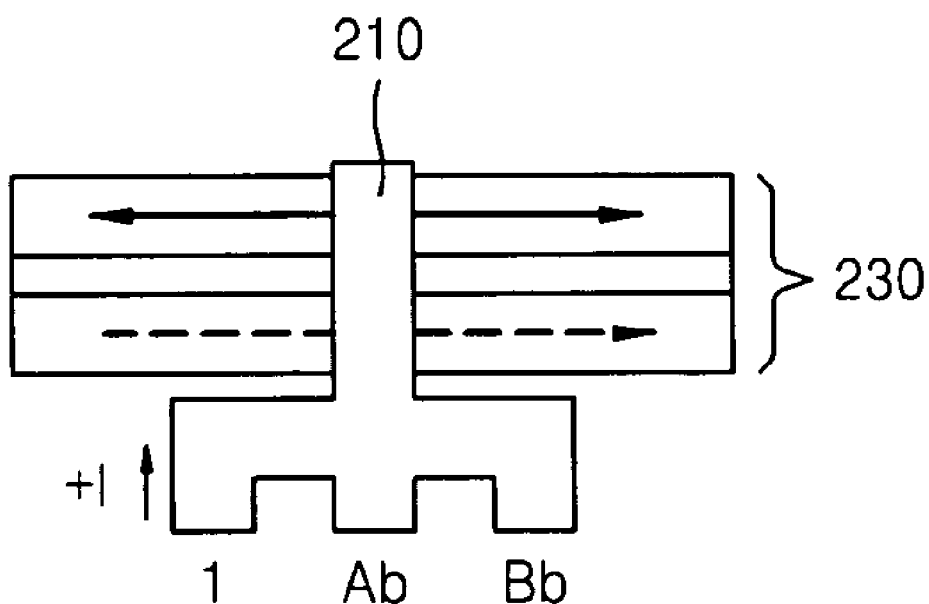

FIG. 7B illustrates resistances according to logical combinations of the input values A and B in the semiconductor memory device of FIG. 7A. The resistance of the resistance-variable element 230 decreases when the input values A and B are both 1 and increases when both the input values A and B are not 1. In this manner, the semiconductor memory device illustrated in FIG. 7A operates as a NAND gate.

FIG. 7C models an operation of determining the magnitude and the direction of a current flowing in the magnetic induction layer 210 according to the input values in the semiconductor memory device of FIG. 7A.

Figure 8A:
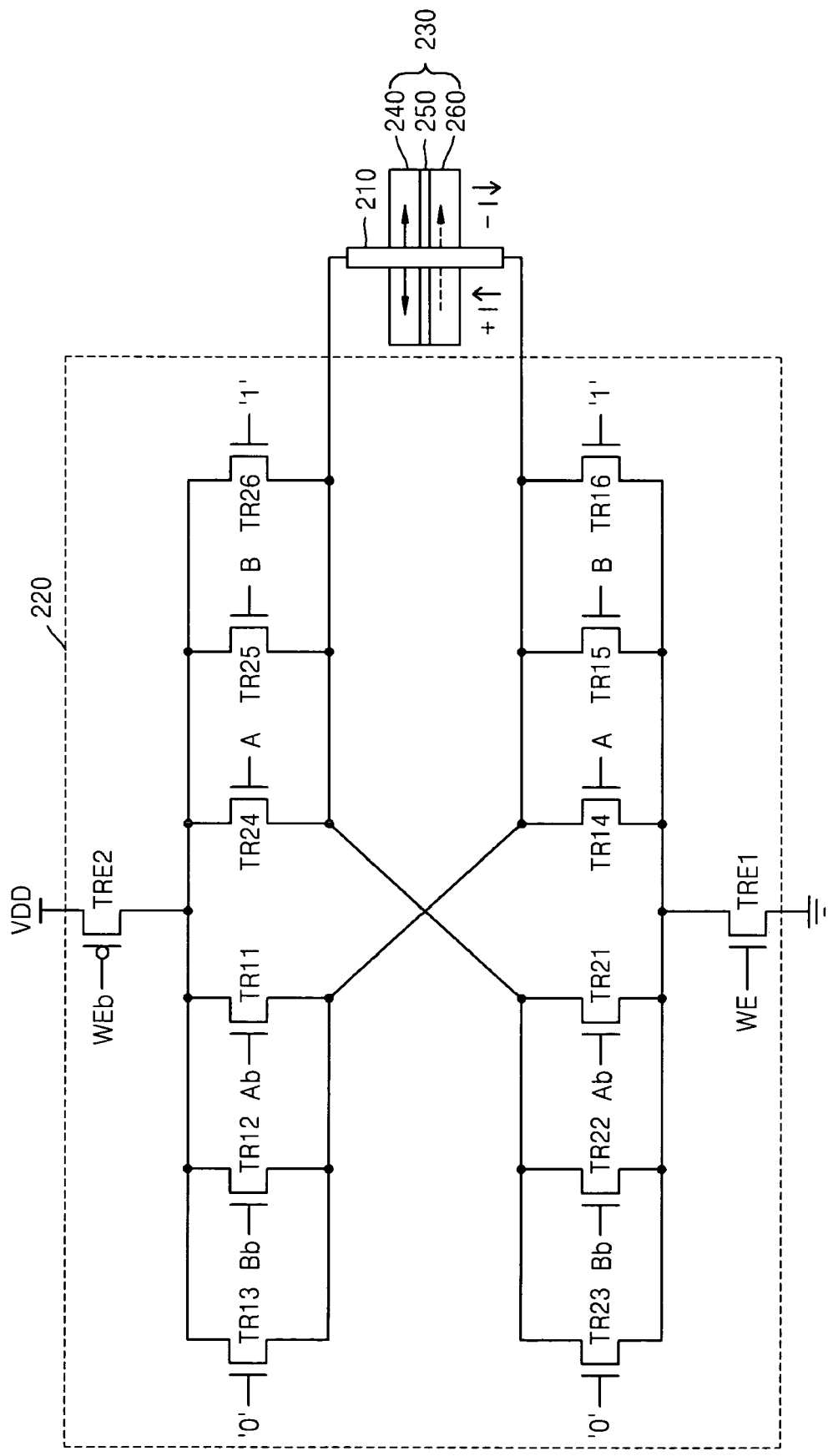
FIGS. 8A, 8B and 8C are diagrams for explaining the semiconductor memory device illustrated in FIG. 3A when used as a NOR gate according to an embodiment of the present invention.

FIG. 8A illustrates the semiconductor memory device of FIG. 3A when used as a NOR gate according to an embodiment of the present invention. Referring to FIG. 8A, 0 is input to the transistors TR13 and TR23 and 1 is input to the transistors TR16 and TR26. Accordingly, the transistors TR13 and TR23 are turned off irrespective of the input values A and B and the transistors TR16 and TR26 are turned on irrespective of the input values A and B.

Figures 8B, 8C:
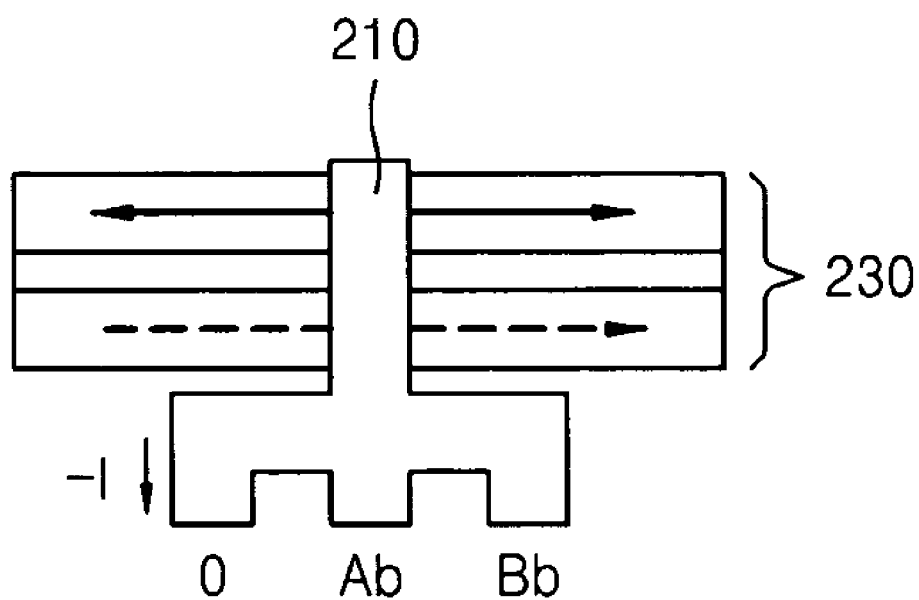

FIG. 8B illustrates resistances according to logical combinations of the input values A and B in the semiconductor memory device of FIG. 8A. The resistance of the resistance-variable element 230 increases when the input values A and B are both 0 and decreases when both the input values A and B are not 0. In this manner, the semiconductor memory device illustrated in FIG. 8A operates as a NOR gate.

FIG. 8C models an operation of determining the magnitude and the direction of a current flowing in the magnetic induction layer 210 according to the input values in the semiconductor memory device of FIG. 8A.

Figures 9A, 9B:
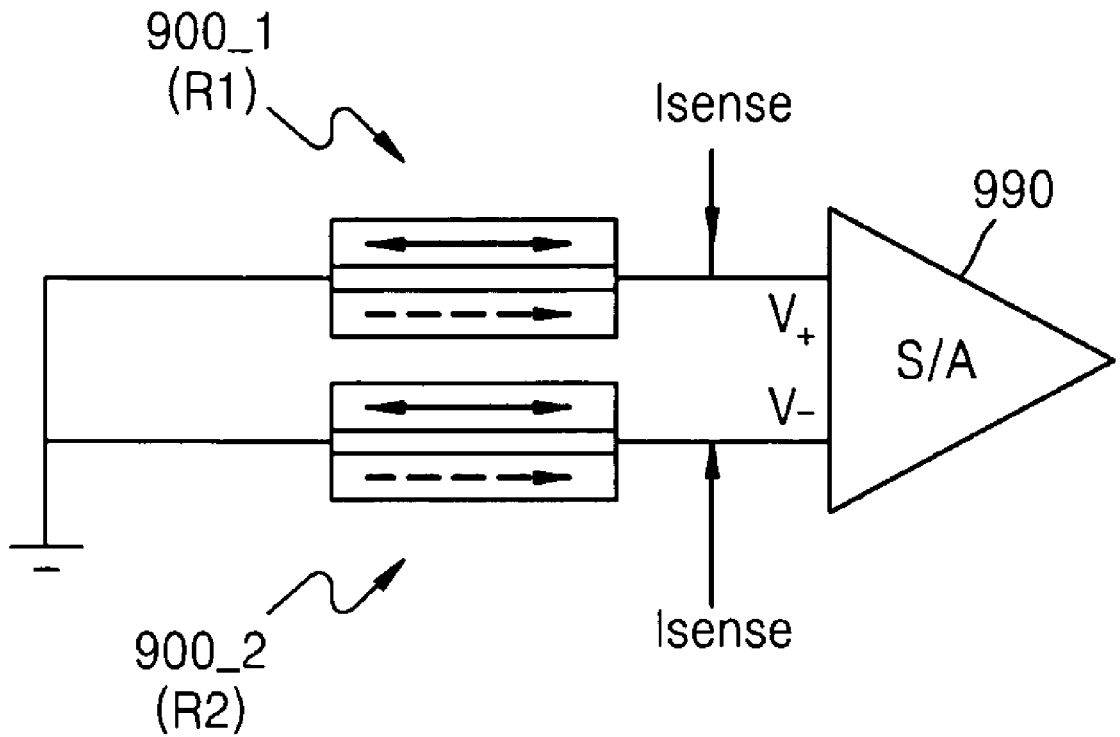
FIGS. 9A and 9B are diagrams for explaining the configuration and the operation of a sense amplifier according to an embodiment of the present invention.

FIG. 9A illustrates a configuration of a sense amplifier according to an embodiment of the present invention, and FIG. 9B is a diagram for explaining the operation of the sense amplifier of FIG. 9A. Referring to FIGS. 9A and 9B, the sense amplifier 990 compares the resistance R1 of a first resistance-variable element 900_1 connected to a first terminal thereof to the resistance R2 of a second resistance-variable element 900_2 connected to a second terminal thereof. The sense amplifier 990 can output a logic high signal S/A OUT when the resistance R1 of the first resistance-variable element 900_1 is higher than the resistance R2 of the second resistance-variable element 900_2 and output a logic low signal S/A OUT when the resistance R1 of the first resistance-variable element 900_1 is lower than or identical to the resistance R2 of the second resistance-variable element 900_2. That is, the sense amplifier 990 can perform a logic AND operation on the resistance R1 of the first resistance-variable element 900_1 and the inverted value of the resistance R2 of the second resistance-variable element 900_2.

The sense amplifier 990 can compare the voltage V+ of the first terminal to the voltage V− of the second terminal using a sensing current Isense to compare the resistance R1 of the first resistance element 900_1 connected to the first terminal to the resistance R2 of the second resistance-variable element 900_2 connected to the second terminal. The sense amplifier 990 can perform a logic AND operation on the voltage V+ of the first terminal and the inverted value of the voltage V− of the second terminal. Preferably, an offset voltage of the second terminal of the sense amplifier 990 is higher than 0 and lower than a value obtained by multiplying a difference between a high resistance and a low resistance of the resistance-variable element 900_1 or 900_2 that can be connected to the terminals of the sense amplifier by the sensing current Isense.

Figures 10A, 10B:
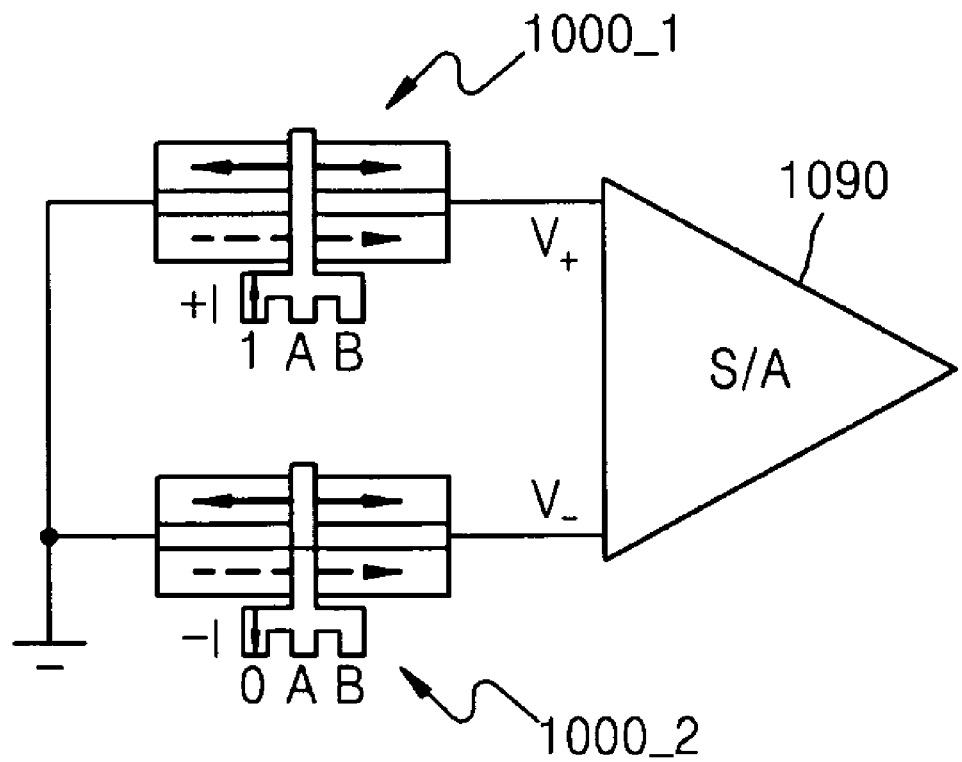
FIGS. 10A and 10B are diagrams for explaining an XOR logic circuit constructed using the semiconductor memory device illustrated in FIG. 3A and the sense amplifier illustrated in FIG. 9A.

FIG. 10A illustrates an XOR logic circuit constructed using the semiconductor memory device of FIG. 3A and the sense amplifier of FIG. 9A. Referring to FIG. 10A, a first resistance-variable element 1000_1 has the same structure as the resistance-variable element 230 of the OR gate illustrated in FIG. 6A and a second resistance-variable element 1000_2 has the same structure as the resistance-variable element 230 of the AND gate illustrated in FIG. 5A. As described above, a sense amplifier 1090 performs a logic AND operation on the resistance of the first resistance-variable element 1000_1 connected to a first terminal thereof and the inverted value of the resistance of the second resistance-variable element 1000_2 connected to a second terminal thereof. As illustrated in FIG. 10B, the output of the sense amplifier 1090 corresponds to the result of a logic XOR operation performed on input values A and B.

FIG. 11A illustrates an XNOR logic circuit constructed using the semiconductor memory device of FIG. 3A and the sense amplifier of FIG. 9A. Referring to FIG. 11A, a first resistance-variable element 1100_1 has the same structure as the resistance-variable element 230 illustrated in FIG. 6A except that the inverted input value Ab instead of the input value A is supplied to the first resistance-variable element 1100_1, and a second resistance-variable element 1100_2 has the same structure as the resistance-variable element 230 illustrated in FIG. 5A except that inverted input value Ab instead of the input value A is supplied to the second resistance-variable element 1100_2. As described above, a sense amplifier 1190 performs a logic AND operation on the resistance of the first resistance-variable element 1100_1 connected to a first terminal thereof and the inverted value of the resistance of the second resistance-variable element 1100_2 connected to a second terminal thereof. As illustrated in FIG. 11B, the output of the sense amplifier 1190 corresponds to the result of a logic XNOR operation performed on input values A and B.

FIGS. 12A, 12B and 12C are diagrams for explaining a logic circuit constructed using four resistance-variable elements 1200_1, 1200_2, 1200_3 and 1200_4 and the sense amplifier illustrated in FIG. 9A. In FIGS. 12A, 12B and 12C, logic states of resistances of the four resistance-variable elements 1200_1, 1200_2, 1200_3 and 1200_4 are denoted as W, X, Y and Z. The logic circuit of FIG. 12A performs a logic operation represented by a logical expression illustrated in FIG. 12B and outputs a logic operation result illustrated in FIG. 12C.

Figure 13A:
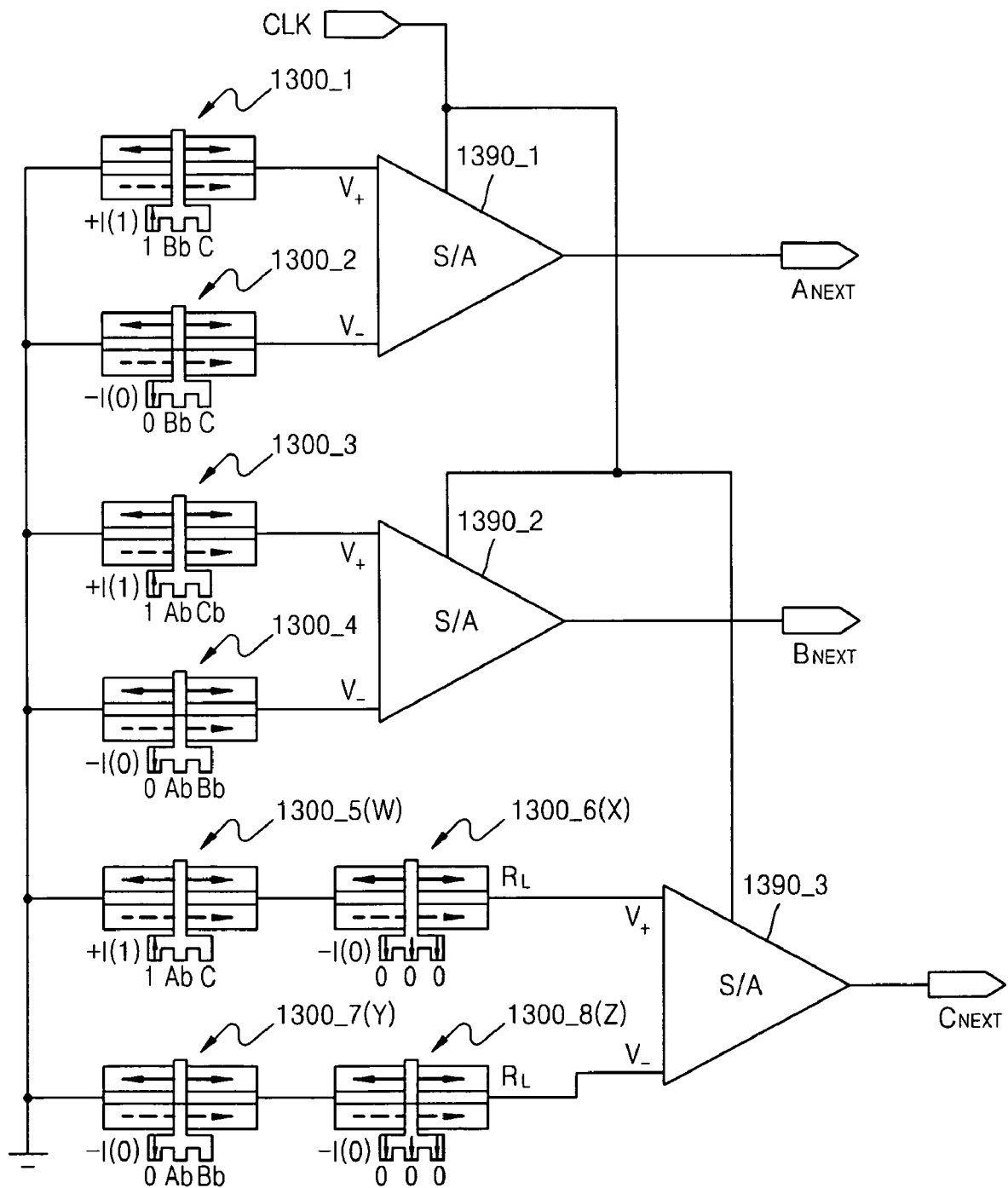

FIG. 13A illustrates a configuration of a 3-bit gray counter according to an embodiment of the present invention, and FIG. 13B illustrates logical expressions representing the operation of the 3-bit gray counter of FIG. 13A.

Referring to FIGS. 13A and 13B, a first resistance-variable element 1300_1 and a second resistance-variable element 1300_2 have the same structure as the resistance-variable elements 1100_1 and 1100_2 illustrated in FIG. 11A except that the inverted input value Bb instead of the inverted input value Ab is supplied and the input value C instead of the input value B is supplied. Accordingly, the first resistance-variable element 1300_1 and the second resistance-variable element 1300_2 perform a logic XNOR operation on the input values B and C. A first sense amplifier 1390_1 carries out a logic AND operation on the result of the logic OR operation performed by the first resistance-variable element 1300_1 connected to a first terminal thereof and the inverted value of the result of the logic AND operation performed by the second resistance-variable element 1300_2 connected to a second terminal thereof. The output of the first sense amplifier 1390_1 corresponds to $A_{NEXT}$ in the logical expressions of FIG. 13B.

A third resistance-variable element 1300_3 has the same structure as the resistance-variable element 230 illustrated in FIG. 7A except that the inverted input value Cb instead of the inverted input value Bb is supplied, and thus the third resistance-variable element 1300_3 performs a logic NAND operation on the input values A and C. A fourth resistance-variable element 1300_4 has the same structure as the resistance-variable element 230 illustrated in FIG. 8A, and thus the fourth resistance-variable element 1300_4 performs a logic NOR operation on the input values A and B. A second sense amplifier 1390_2 carries out a logic AND operation on the result of the logic NAND operation performed by the third resistance-variable element 1300_3 connected to a first terminal thereof and the inverted value of the result of the logic NOR operation performed by the fourth resistance-variable element 1300_4 connected to a second terminal thereof. The output of the second sense amplifier 1390_2 corresponds to $B_{NEXT}$ in the logical expressions of FIG. 13B.

A fifth resistance-variable element 1300_5 has the same structure as the resistance-variable element 230 illustrated in FIG. 6A except that the inverted input value Ab instead of the input value A is supplied and the input value C instead of the input value B is supplied. Accordingly, the fifth resistance-variable element 1300_5 performs a logic OR operation on the inverted input value Ab and the input value C. A sixth resistance-variable element 1300_6 has a fixed high resistance. That is, the logic operation result of the sixth resistance-variable element 1300_6 is 0. A seventh resistance-variable element 1300_7 has the same structure as the resistance-variable element 230 illustrated in FIG. 8A.

Accordingly, the seventh resistance-variable element 1300_7 performs a logic NOR operation on the input value A and the input value B. An eighth resistance-variable element 1300_8 has a fixed low resistance. That is, the logic operation result of the eighth resistance-variable element 1300_8 is 0.

When the logic operation results of the fifth, sixth, seventh and eighth resistance-variable elements 1300_5, 1300_6, 1300_7 and 1300_8 are applied to the logic gate illustrated in FIG. 12A, the output of a third sense amplifier 1390_3 becomes $C_{NEXT}$ in the logical expression of FIG. 13B.

FIG. 13C illustrates the outputs of the first, second and third sense amplifiers 1390_1, 1390_2 and 1390_3 in response to the three input values A, B and C. It can be known from FIG. 13C that the logic circuit illustrated in FIG. 13A performs a 3-bit gray counting operation.

Figure 14A:
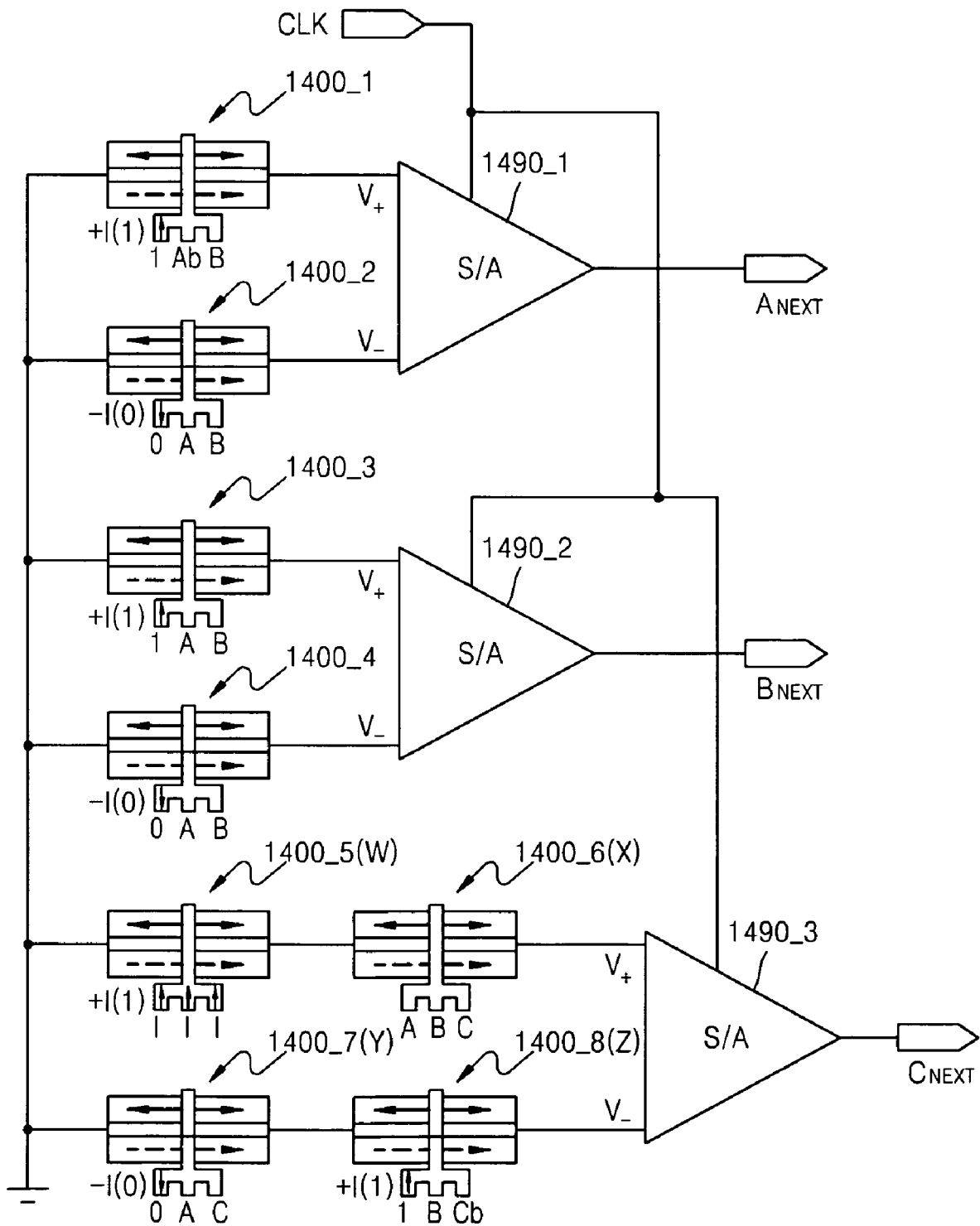

FIG. 14A illustrates a configuration of a 3-bit up-counter according to an embodiment of the present invention, and FIG. 13B illustrates logical expressions representing the operation of the 3-bit up-counter of FIG. 14A. Referring to FIGS. 14A and 14B, a first resistance-variable element 1400_1 has the same structure as the resistance-variable element 230 illustrated in FIG. 6A except that the inverted input value Ab instead of the input value A is supplied. Accordingly, the first resistance-variable element 1400_1 performs a logic OR operation on the inverted input value Ab and the input value B. A second resistance-variable element 1400_2 has the same structure as the resistance-variable element 230 illustrated in FIG. 5A, and thus the second resistance-variable element 1400_2 performs a logic AND operation on the input values A and B. A first sense amplifier 1490_1 carries out a logic AND operation on the result of the logic OR operation performed by the first resistance-variable element 1400_1 connected to a first terminal thereof and the inverted value of the result of the logic AND operation performed by the second resistance-variable element 1400_2 connected to a second terminal thereof. The output of the first sense amplifier 1490_1 corresponds to $A_{NEXT}$ in the logical expressions of FIG. 14B.

A third resistance-variable element 1400_3 and a fourth resistance-variable element 1400_4 have the same structure as the resistance-variable elements 1000_1 and 1000_2 illustrated in FIG. 10A. Accordingly, the third and fourth resistance-variable elements 1400_3 and 1400_4 perform a logic XOR operation on the input values A and B. A second sense amplifier 1490_2 carries out a logic AND operation on the result of the logic OR operation performed by the third resistance-variable element 1400_3 connected to a first terminal thereof and the inverted value of the result of the logic AND operation performed by the fourth resistance-variable element 1400_4 connected to a second terminal thereof. The output of the second sense amplifier 1490_2 corresponds to $B_{NEXT}$ in the logical expressions of FIG. 14B.

A fifth resistance-variable element 1400_5 has a fixed high resistance. That is, the logic operation result W of the fifth resistance-variable element 1400_5 is 1. A sixth resistance-variable element 1400_6 has the same structure as the resistance-variable element 230 illustrated in FIG. 3A. That is, the logic operation result X of the sixth resistance-variable element 1400_6 corresponds to (A*B)+(B*C)+(C*A). A seventh resistance-variable element 1400_7 has the same structure as the resistance-variable element 230 illustrated in FIG. 5A except that the input value C instead of the input value B is supplied, and thus the logic operation result Y of the seventh resistance-variable element 1400_7 corresponds to A*C. An eighth resistance-variable element 1400_8 has the same structure as the resistance-variable element illustrated in FIG. 6A except that the inverted input value Cb instead of the input value A is supplied, and thus the logic operation result Z of the eighth resistance-variable element 1400_8 corresponds to B+Cb.

When the logic operation results of the fifth, sixth, seventh and eighth resistance-variable elements 1400_5, 1400_6, 1400_7 and 1400_8 are applied to the logic gate illustrated in FIG. 12A, the output of a third sense amplifier 1490_3 becomes $C_{NEXT}$ in the logical expression of FIG. 14B.

FIG. 14C illustrates the outputs of the first, second and third sense amplifiers 1490_1, 1490_2 and 1490_3 in response to the three input values A, B and C. It can be known from FIG. 14C that the logic circuit illustrated in FIG. 14A performs a 3-bit up-counting operation.

Figure 15A:
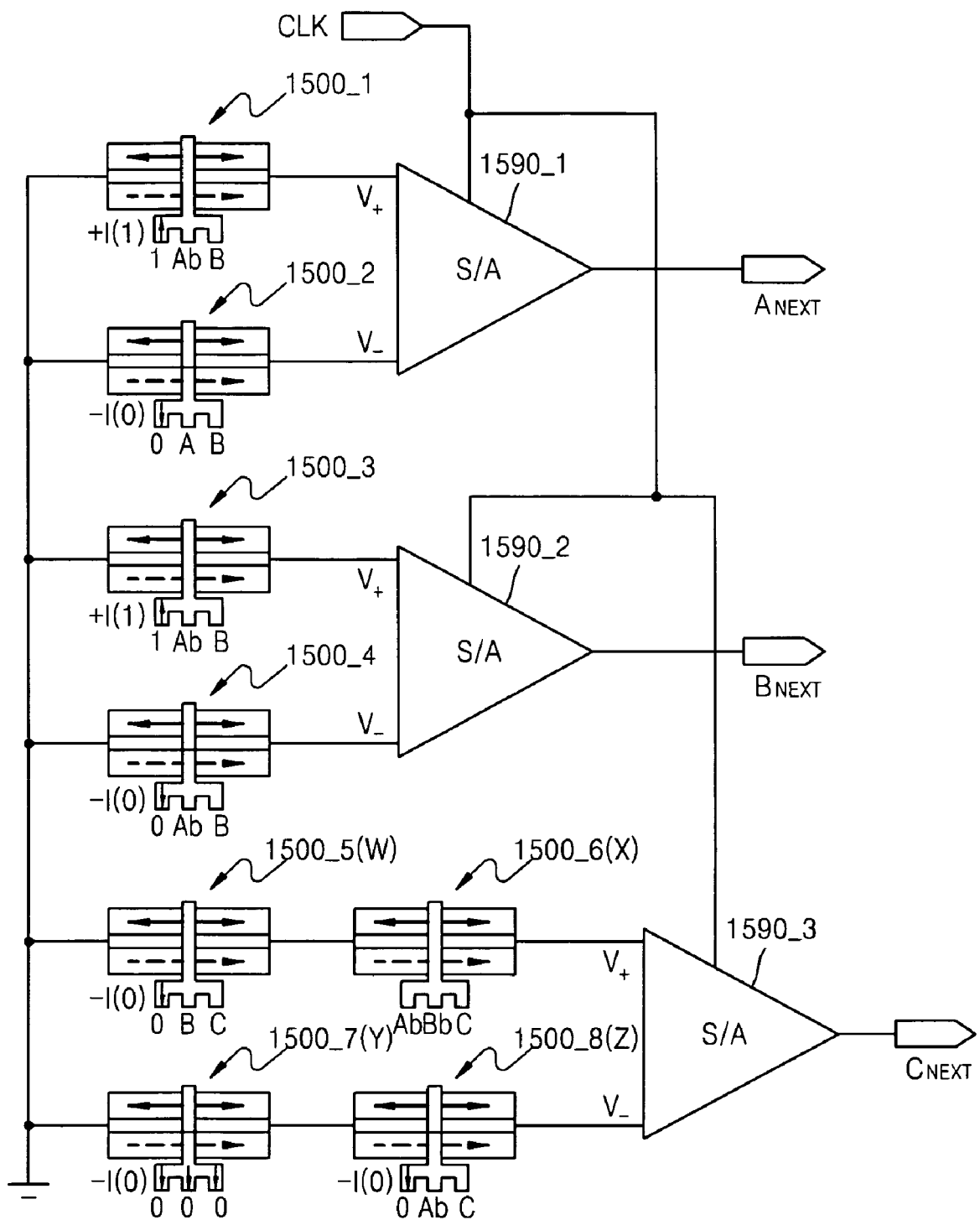

FIG. 15A illustrates a configuration of a 3-bit down-counter according to an embodiment of the present invention, and FIG. 15B illustrates logical expressions representing the operation of the 3-bit down-counter of FIG. 15A. Referring to FIGS. 15A and 15B, a first resistance-variable element 1500_1, a second resistance-variable element 1500_2 and a first sense amplifier 1590_1 respectively have the same structures as the first resistance-variable element 1400_1, the second resistance-variable element 1400_2 and the first sense amplifier 1490_1, and thus the output of the first sense amplifier 1590_1 corresponds to $A_{NEXT}$ in the logical expressions of FIG. 15B.

A third resistance-variable element 1500_3 and a fourth resistance-variable element 1500_4 have the same structure as the resistance-variable elements 1100_1 and 1100_2 illustrated in FIG. 11A. Accordingly, the third and fourth resistance-variable elements 1500_3 and 1500_4 perform a logic XNOR operation on the input values A and B. A second sense amplifier 1590_2 carries out a logic AND operation on the result of the logic OR operation performed by the third resistance-variable element 1500_3 connected to a first terminal thereof and the inverted value of the result of the logic AND operation performed by the fourth resistance-variable element 1500_4 connected to a second terminal thereof. The output of the second sense amplifier 1590_2 corresponds to $B_{NEXT}$ in the logical expressions of FIG. 15B.

A fifth resistance-variable element 1500_5 has the same structure as the resistance-variable element 230 illustrated in FIG. 5A except that the input value C instead of the input value A is supplied, and thus the logic operation result W of the fifth resistance-variable element 1500_5 corresponds to B*C. A sixth resistance-variable element 1500_6 has the same structure as the resistance-variable element illustrated in FIG. 4A except that the input value C instead of the inverted input value Cb is supplied. That is, the logic operation result X of the sixth resistance-variable element 1500_6 correspond to (Ab*Bb)+(Bb*C)+(C*Ab). A seventh resistance-variable element 1500_7 has a fixed low resistance. That is, the logic operation result X of the seventh resistance-variable element 1500_7 is 0. An eighth resistance-variable element 1500_8 has the same structure as the resistance-variable element 230 illustrated in FIG. 5A except that the inverted input value Ab instead of the input value A is supplied and the input value C instead of the input value B is supplied, and thus the logic operation result Z of the eighth resistance-variable element 1500_8 corresponds to Ab*C.

When the logic operation results of the fifth, sixth, seventh and eighth resistance-variable elements 1500_5, 1500_6, 1500_7 and 1500_8 are applied to the logic gate illustrated in FIG. 12A, the output of a third sense amplifier 1590_3 becomes $C_{NEXT}$ in the logical expressions of FIG. 15B.

FIG. 15C illustrates the outputs of the first, second and third sense amplifiers 1590_1, 1590_2 and 1590_3 in response to the three input values A, B and C. It can be known from FIG. 15C that the logic circuit illustrated in FIG. 15A performs a 3-bit down-counting operation.

Figure 16A:
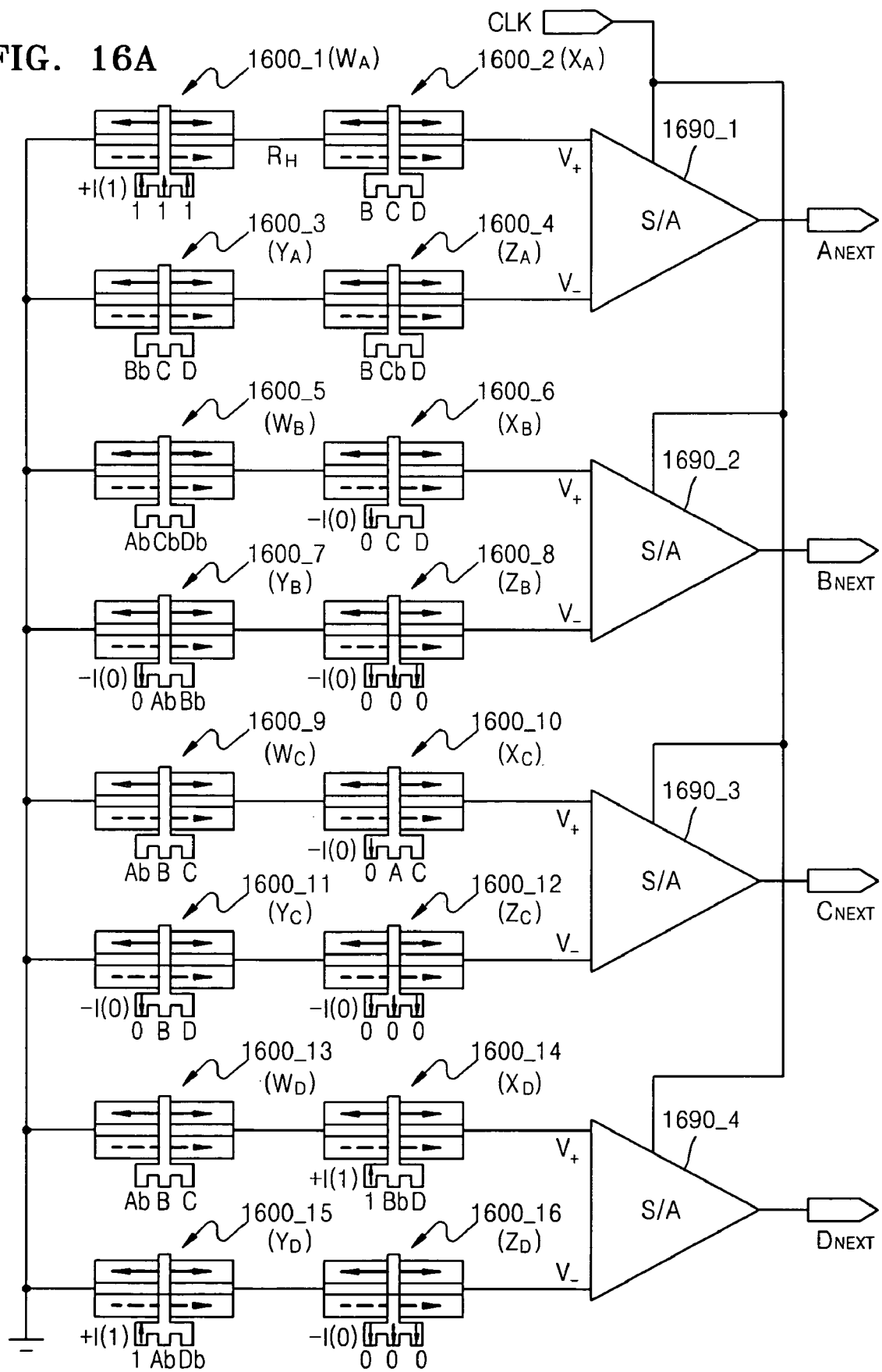

FIG. 16A illustrates a configuration of a 4-bit gray counter according to an embodiment of the present invention, FIG. 16B illustrates logical expressions representing the operation of the 4-bit gray counter illustrated in FIG. 16A, and FIG. 16C illustrates a logic table for explaining the operation of the 4-bit gray counter illustrated in FIG. 16A. Referring to FIGS. 16A, 16B and 16C, the logic circuit illustrated in FIG. 16A performs a 4-bit gray counting operation.

Figure 17A:
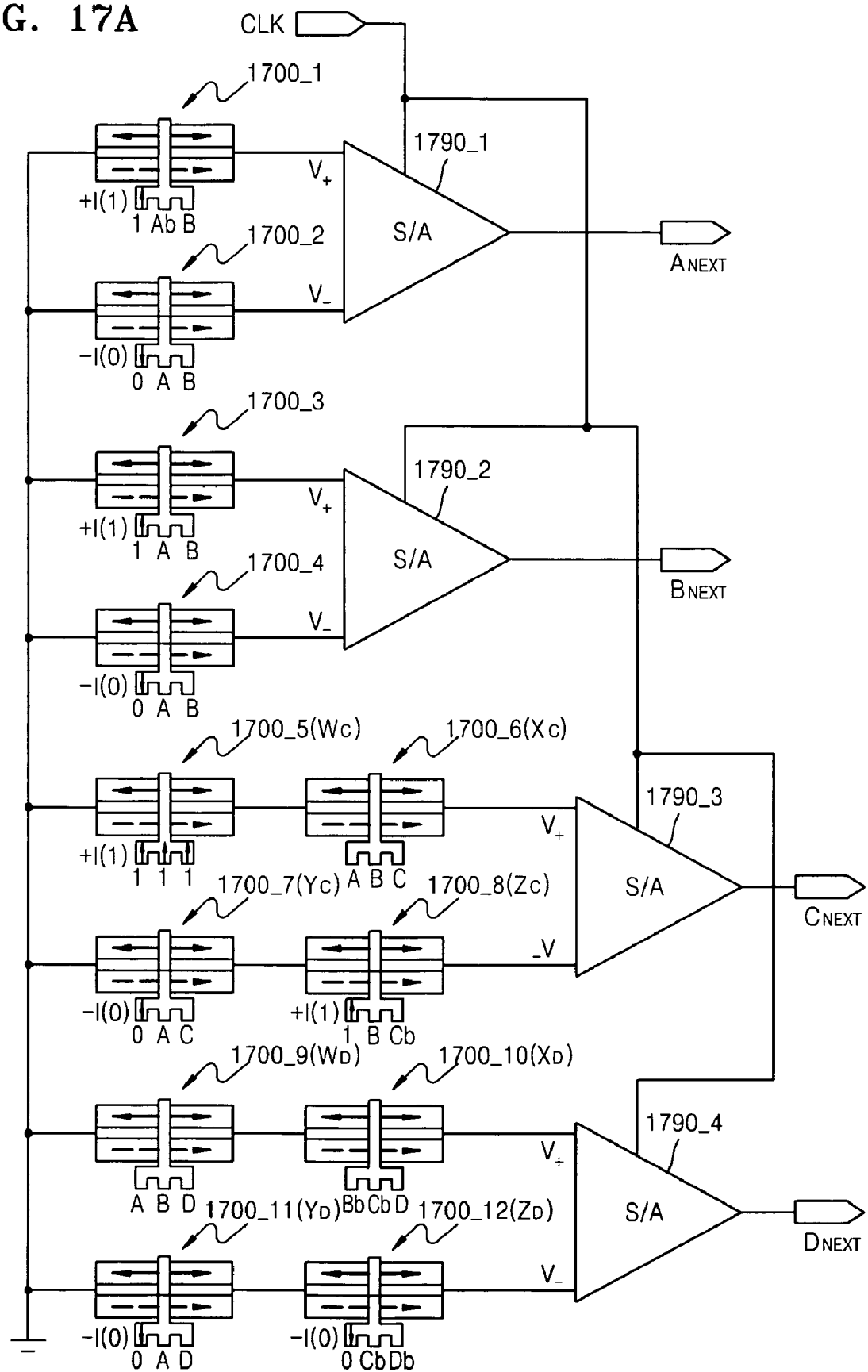

FIG. 17A illustrates a configuration of a 4-bit up-counter according to an embodiment of the present invention, FIG. 17B illustrates logical expressions representing the operation of the 4-bit up-counter illustrated in FIG. 17A, and FIG. 17C illustrates a logic table for explaining the operation of the 4-bit up-counter illustrated in FIG. 17A. Referring to FIGS. 17A, 17B and 17C, the logic circuit illustrated in FIG. 17A performs a 4-bit up-counting operation.

Figure 18A:
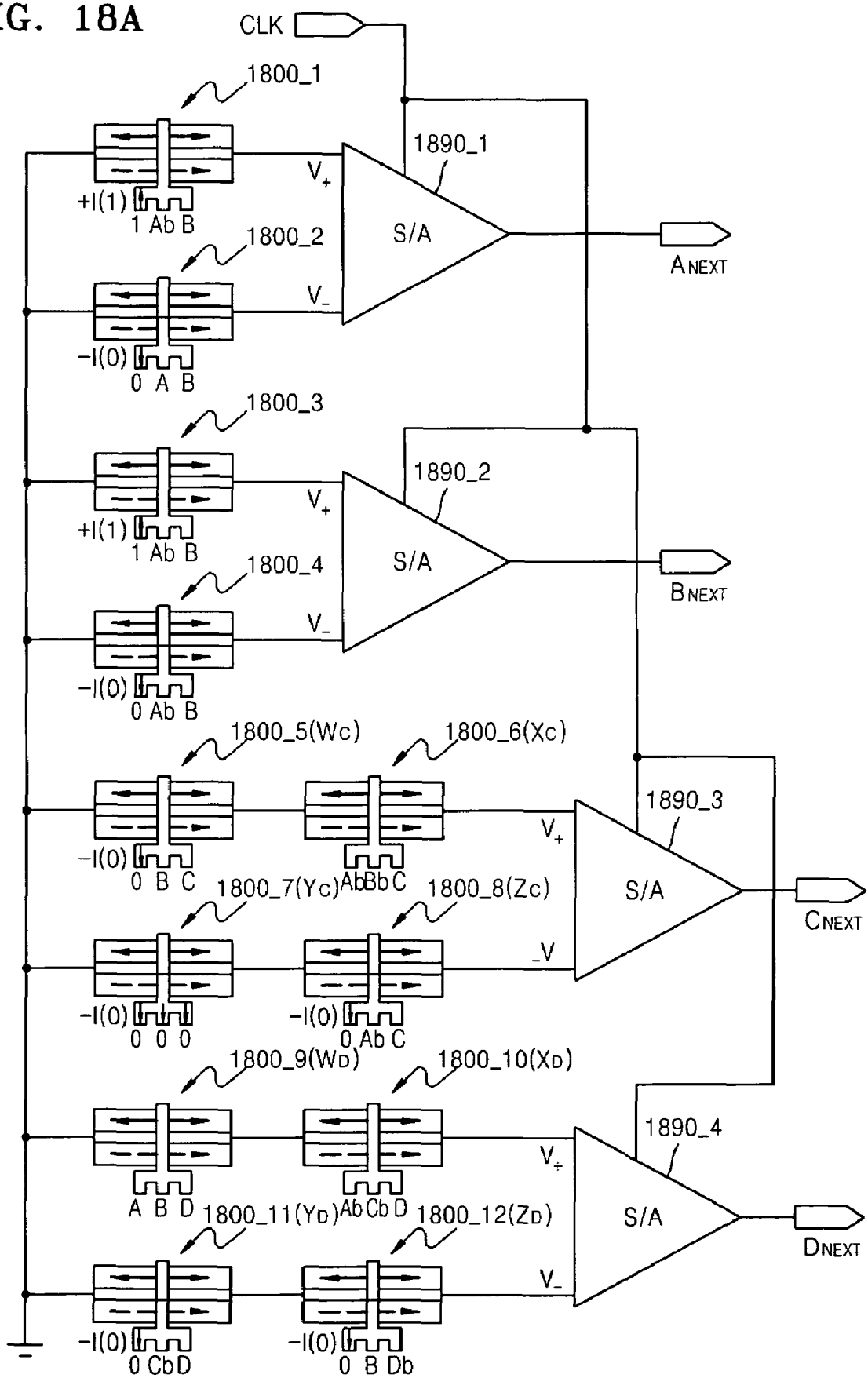

FIG. 18A illustrates a configuration of a 4-bit down-counter according to an embodiment of the present invention, FIG. 18B illustrates logical expressions representing the operation of the 4-bit down-counter illustrated in FIG. 18A, and FIG. 18C illustrates a logic table for explaining the operation of the 4-bit down-counter illustrated in FIG. 18A. Referring to FIGS. 18A, 18B and 18C, the logic circuit illustrated in FIG. 18A performs a 4-bit down-counting operation.

Those of ordinary skill in the art will understand the structures and operations of the 4-bit counters illustrated in FIGS. 16A, 17A and 18A with reference to the structures and operations of the logic circuits illustrated in FIGS. 3 through 15 so that detailed explanations thereof will be omitted.

Figure 19:
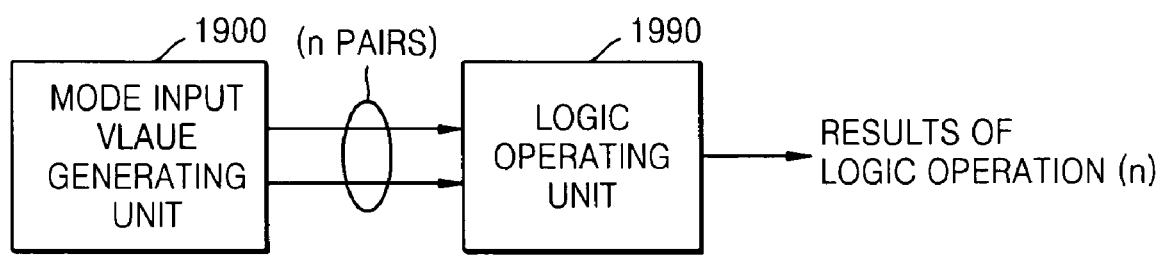
FIG. 19 illustrates a diagram for explaining a field programmable semiconductor memory device according to an embodiment of the present invention.

FIG. 19 illustrates a diagram for explaining a field programmable semiconductor memory device according to an embodiment of the present invention. Referring to FIG. 19, the field programmable semiconductor memory device includes a mode input value generating unit 1900 and a logic operating unit 1990. The mode input value generating unit 1900 defines a logic function for each magnetic memory cell with regard to at least two modes by changing a connection state between input values of a current driving circuit. The logic operating unit 1990 performs a logic operation using output values for each magnetic memory cell having the logic function which is defined by the mode input value generating unit 1900 and outputs a result of logic operation.

According to an embodiment of the present invention, the mode input value generating unit 1900 provides two logic functions as output values and the logic operating unit 1990 performs an operation such as sense amplification on the two logic functions to output a single result of logic operation. As such, in a 3-bit integrated counter operating at three modes, the mode input value generating unit 1900 provides three pairs of two logic functions and the logic operating unit 1990 performs logic operation on each pair of two logic functions and outputs three results of logic operation.

Figure 20:
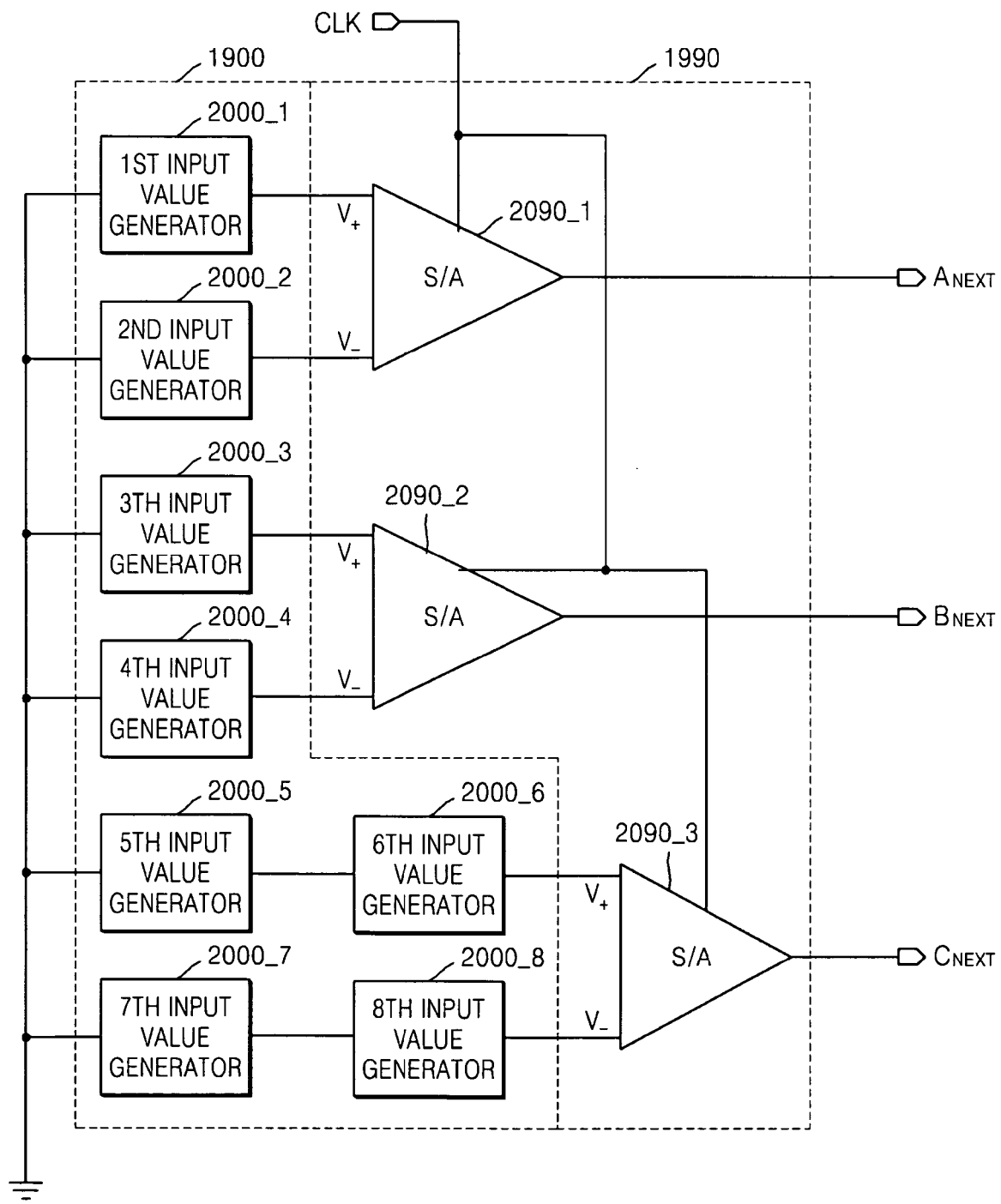
FIG. 20 illustrates a diagram for explaining a field programmable semiconductor memory device when used as a 3-bit integrated counter logic circuit according to an embodiment of the present invention.

FIG. 20 illustrates a diagram for explaining a field programmable semiconductor memory device when used as a 3-bit integrated counter logic circuit according to an embodiment of the present invention. An integrated counter means a counter which operates at at least two modes among gray counting, up-counting and down-counting. The 3-bit integrated counter according to an embodiment of the present invention operates at three modes.

Referring to FIG. 20, the mode input value generating unit 1900 includes a first input value generator through an eighth input value generator 2000_1, 2000_2, 2000_3, 2000_4, 2000_5, 2000_6, 2000_7 and 2000_8. The first input value generator 2000_1 changes a connection state between input values of each current driving circuit to be connected, so as to operate as a resistance-variable element 1300_1 of FIG. 13A, a resistance-variable element 1400_1 of FIG. 14A or a resistance-variable element 1500_1 of FIG. 15A according to a counting mode. The second input value generator 2000_2 changes a connection state between input values of each current driving circuit to be connected, so as to operate as a resistance-variable element 1300_2 of FIG. 13A, a resistance-variable element 1400_2 of FIG. 14A or a resistance-variable element 1500_2 of FIG. 15A according to a counting mode. The third input value generator 2000_3 changes a connection state between input values of each current driving circuit to be connected, so as to operate as a resistance-variable element 1300_3 of FIG. 13A, a resistance-variable element 1400_3 of FIG. 14A or a resistance-variable element 1500_3 of FIG. 15A according to a counting mode. The fourth input value generator 2000_4 changes a connection state between input values of each current driving circuit to be connected, so as to operate as a resistance-variable element 1300_4 of FIG. 13A, a resistance-variable element 1400_4 of FIG. 14A or a resistance-variable element 1500_4 of FIG. 15A according to a counting mode. The fifth input value generator 2000_5 changes a connection state between input values of each current driving circuit to be connected, so as to operate as a resistance-variable element 1300_5 of FIG. 13A, a resistance-variable element 1400_5 of FIG. 14A or a resistance-variable element 1500_5 of FIG. 15A according to a counting mode. The sixth input value generator 2000_6 changes a connection state between input values of each current driving circuit to be connected, so as to operate as a resistance-variable element 1300_6 of FIG. 13A, a resistance-variable element 1400_6 of FIG. 14A or a resistance-variable element 1500_6 of FIG. 15A according to a counting mode. The seventh input value generator 2000_7 changes a connection state between input values of each current driving circuit to be connected, so as to operate as a resistance-variable element 1300_7 of FIG. 13A, a resistance-variable element 1400_7 of FIG. 14A or a resistance-variable element 1500_7 of FIG. 15A according to a counting mode. The eighth input value generator 2000_8 changes a connection state between input values of each current driving circuit to be connected, so as to operate as a resistance-variable element 1300_8 of FIG. 13A, a resistance-variable element 1400_8 of FIG. 14A or a resistance-variable element 1500_8 of FIG. 15A according to a counting mode.

The logic operating unit 1990 includes a plurality of sense amplifiers 2090_1, 2090_2 and 2090_3. Each of the sense amplifiers 2090_1, 2090_2 and 2090_3 performs a logic operation on two logic functions provided from the mode input value generating unit 1900 and generates output values $A_{NEXT}$, $B_{NEXT}$ and $C_{NEXT}$, corresponding to each bit.

Figure 21A:
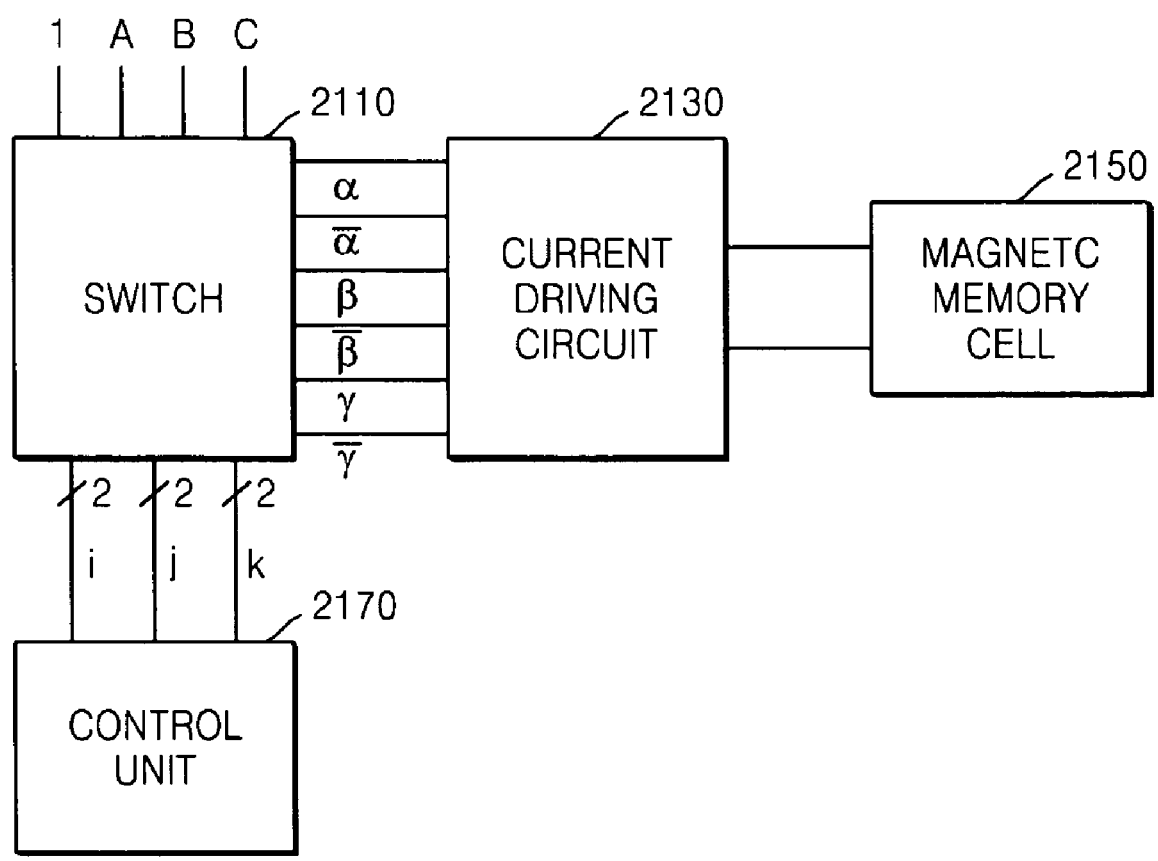
FIGS. 21A, 21B and 21C are detailed diagrams for explaining a $1^{st}$ input generator through an $8^{th}$ input generator of FIG. 20 according to an embodiment of the present invention.
Figure 21B:
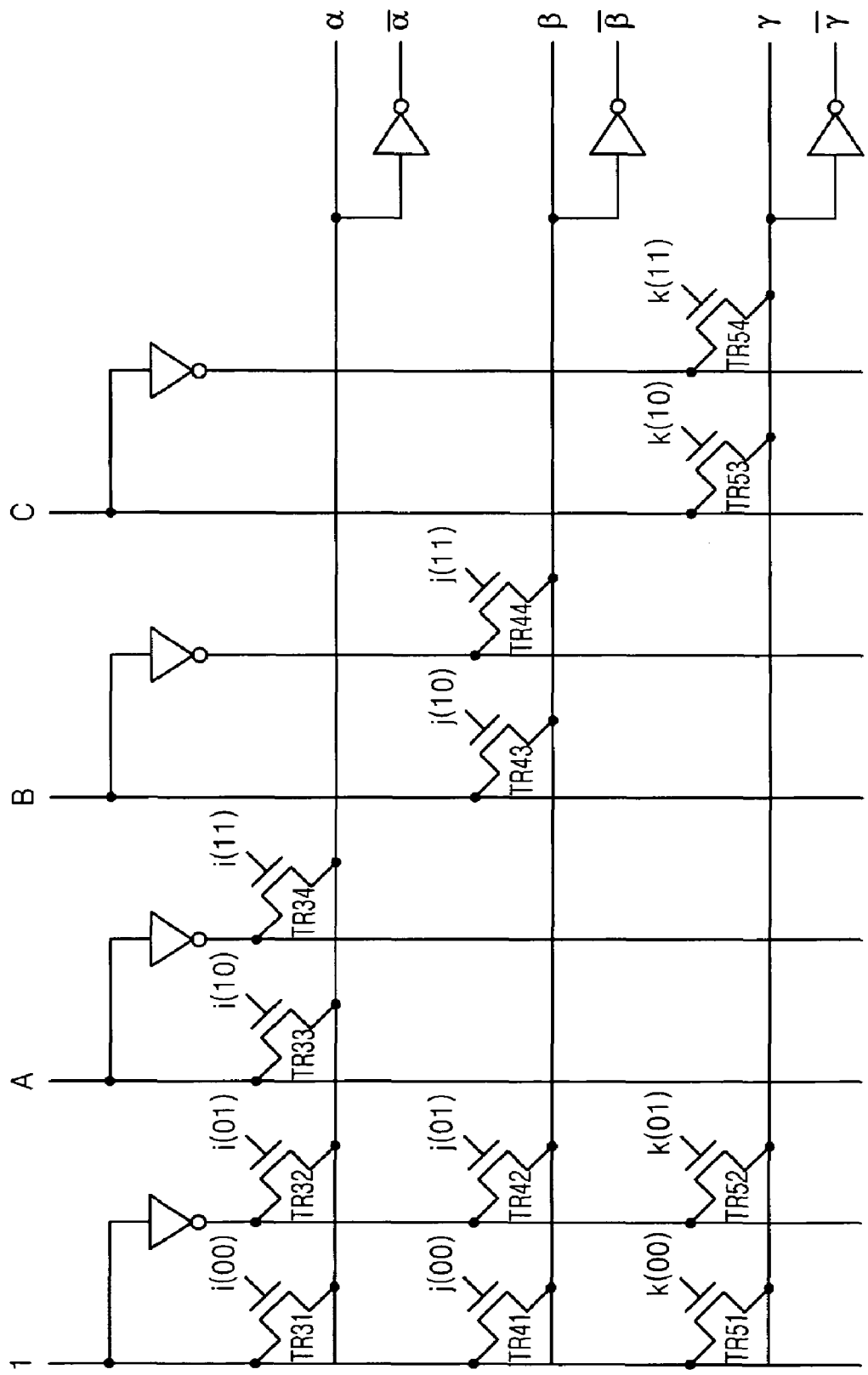
Figure 21C:
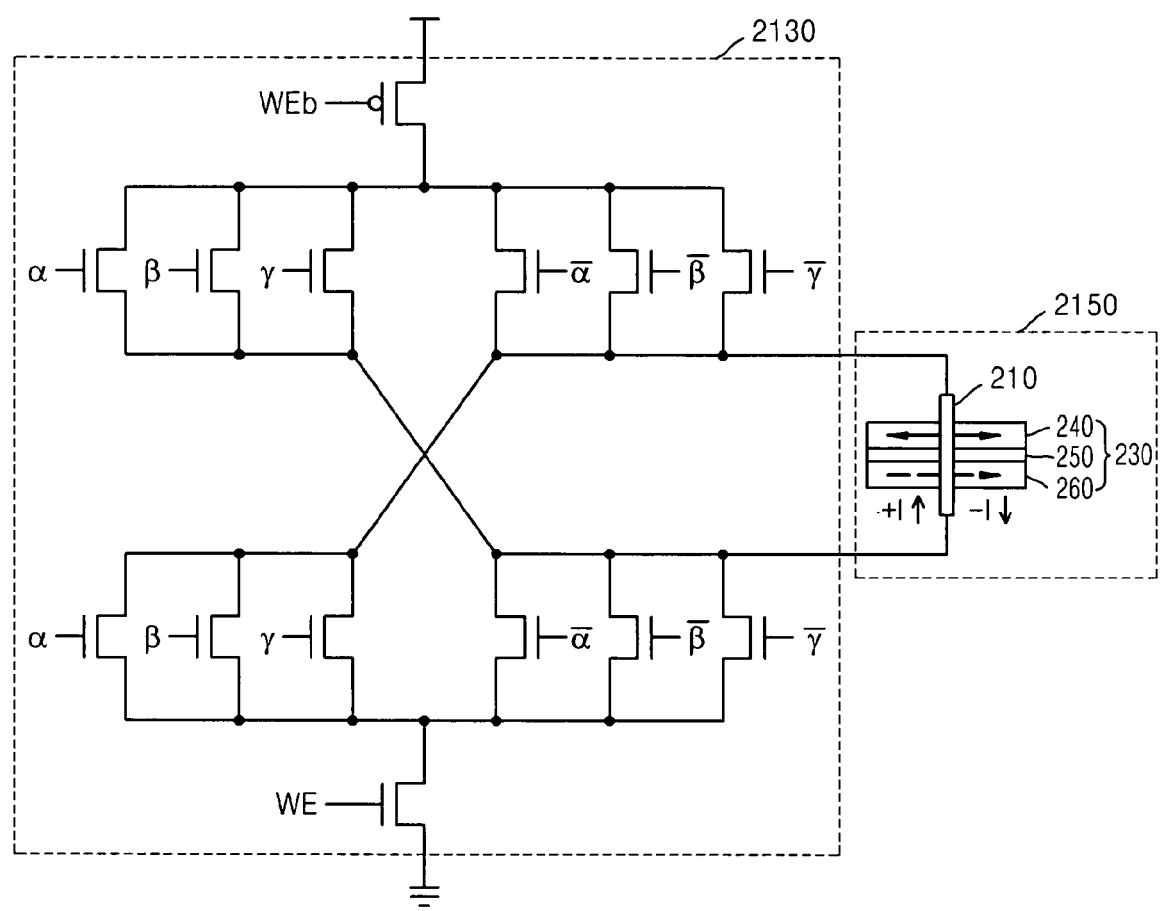

FIGS. 21A, 21B and 21C are detailed diagrams for explaining the first input value generator through the eight input value generator of FIG. 20 according to an embodiment of the present invention. Referring to FIG. 21A, each of the first input value generator through the eight input value generator 2000_1, 2000_2, 2000_3, 2000_4, 2000_5, 2000_6, 2000_7 and 2000_8 includes a switch 2110, a current driving circuit 2130, a magnetic memory cell 2150 and a control unit 2170.

The switch 2110 includes a plurality of transistors TR31~TR34, TR41~TR44, and TR51~TR54 each of which connects a plurality of initial input values or a plurality of inverted values of the initial input values to a plurality of intermediate input values or a plurality of inverted values of the intermediate input values, as shown in FIG. 21B. The switch 2110 turns on corresponding transistors using a first control signal through a third control signal i, j and k of two bits and connects the initial input values or the inverted values of the initial input values to the intermediate input values or the inverted values of the intermediate input values, so as to correspond four initial input values 1, A, B and C and four inverted values of the initial input values 0, /A, /B and /C to three intermediate input values α, β and γ and three inverted values of the intermediate input values /α, /β and /γ, in response to a counting mode.

The current driving circuit 2130 changes a connection state between input values according to an operation of the switch 2110 corresponding to a counting mode, as shown in FIG. 21C.

The magnetic memory cell 2150 includes a resistance-variable element and defines a logic function using a magnetically induced current provided from the current driving circuit 2130 having a changed connection state between input values, in response to a counting mode.

The control unit 2170 provides the first control signal through the third control signal i, j and k to the switch 2110.

FIGS. 22A, 22B and 22C are tables for explaining states of control signals which is provided to each transistor used as a switch in response to a counting mode, according to an embodiment of the present invention. FIG. 22A shows logic states of the first control signal through the third control signal i, j and k when the 3-bit integrated counter operates at a gray counting mode, FIG. 22B shows logic states of the first control signal through the third control signal i, j and k when the 3-bit integrated counter operates at a up-counting mode, and FIG. 22C shows logic states of the first control signal through the third control signal i, j and k when the 3-bit integrated counter operates at a down-counting mode.

Specifically, as an example, in order to control the first input value generator 2000_1 of FIG. 20 to operate at the gray counting mode, it is necessary to make the first input value generator 2000_1 of FIG. 20 operate as the first resistance-variable element 1300_1 of FIG. 13A. To this end, the first control signal through the third control signal i, j and k are provided to turn on three transistors TR31, TR44 and TR53. In order to control the first input value generator 2000_1 of FIG. 20 to operate at the up-counting mode, it is necessary to make the first input value generator 2000_1 of FIG. 20 operate as the first resistance-variable element 1400_1 of FIG. 14A. To this end, the first control signal through the third control signal i, j and k are provided to turn on three transistors TR34, TR43 and TR51. In order to control the first input value generator 2000_1 of FIG. 20 to operate at the down-counting mode, it is necessary to make the first input value generator 2000_1 of FIG. 20 operate as the first resistance-variable element 1500_1 of FIG. 15A. To this end, the first control signal through the third control signal i, j and k are provided to turn on three transistors TR34, TR43 and TR51.

Figure 23:
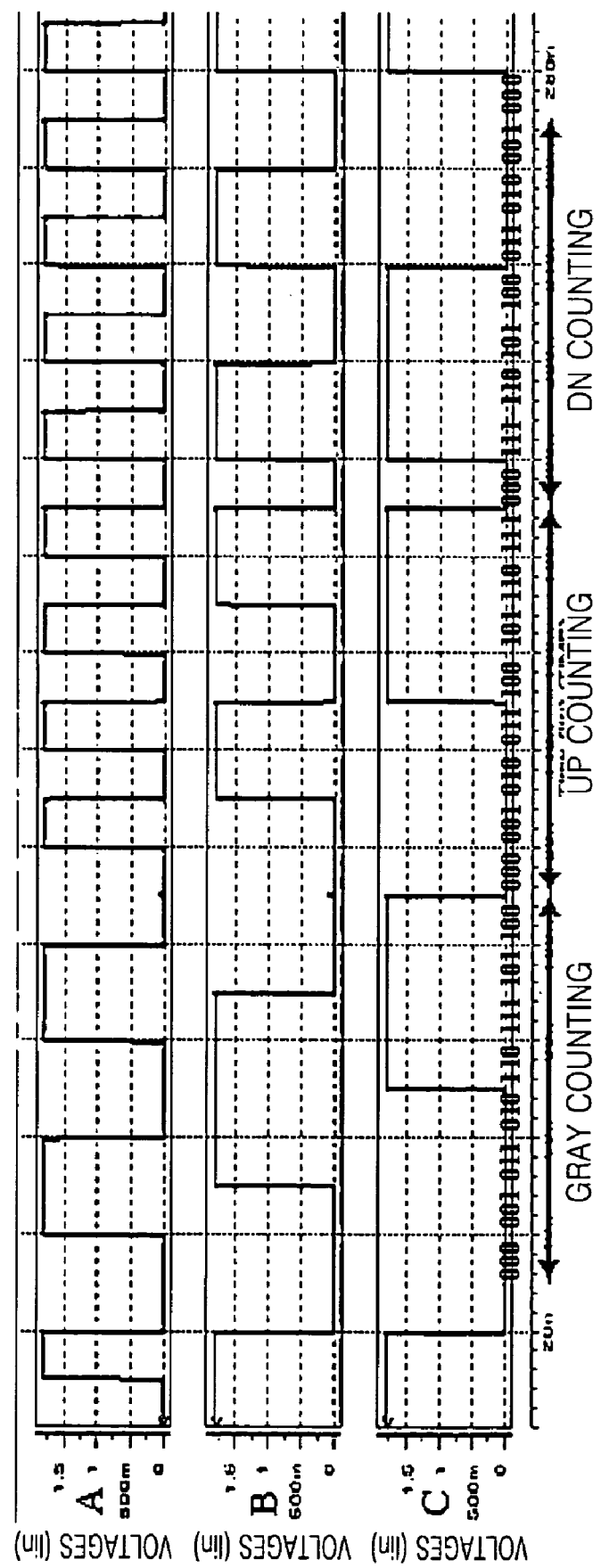
FIG. 23 illustrates a graph of showing a simulation result of a 3-bit integrated counter logic circuit of FIG. 20.

FIG. 23 illustrates a graph of showing a simulation result of a 3-bit integrated counter logic circuit of FIG. 20. Referring to FIG. 23, it shows that the 3-bit integrated counter operates at three modes of gray counting, up-counting and down-counting.

According to the above, an example of the 3-bit integrated counter operating at three modes is explained, but those of ordinary skill in the art will easily extend the configuration of the 3-bit integrated counter to N-bit, where N is greater than or equal to 4, integrated counter. In addition, embodiments of the present invention are not limited a the integrated counter and it is possible to implement a single semiconductor memory device to operate at two modes, for example, an XOR gate logic circuit of FIG. 10A and an XNOR gate logic circuit of FIG. 11A.

As described above, the semiconductor memory device and the method of programming the same according to embodiments of the present invention change the direction of a magnetically induced current flowing in a magnetic induction layer according to a combination of a plurality of input values. Accordingly, the number of magnetic induction layers can be reduced. In addition, an efficient configuration in hardware can be achieved because it is possible to operate a single semiconductor memory device at at least two modes through changes in a connection state between input values of a current driving circuit connected to a magnetic memory cell, in response to a mode. In addition, because data can be kept in the semiconductor memory device even in a power-off condition, a continuous operation is ensured when a power is again on after the power-off condition.

While aspects of the present invention has been particularly shown and described with reference to differing embodiments thereof, it should be understood that these exemplary embodiments should be considered in a descriptive sense only and not for purposes of limitation. Any narrowing or broadening of functionality or capability of an aspect in one embodiment should not considered as a respective broadening or narrowing of similar features in a different embodiment, i.e., descriptions of features or aspects within each embodiment should typically be considered as available for other similar features or aspects in the remaining embodiments.

Thus, although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor memory device comprising:
    a mode input value generating unit to change a connection state between input values of a current driving circuit so as to correspond to each of at least two operating modes, and to define a logic function of a magnetic memory cell connected to the current driving circuit, in response to each operating mode; and
    a logic operating unit to perform a logic operation on the logic functions of at least two magnetic memory cells defined according to each of the operating modes and to generate a result of logic operation.

2. The semiconductor memory device of claim 1, wherein the mode input value generating unit includes a switch to connect a plurality of initial input values to a plurality of intermediate input values according to a predetermined control signal so as to correspond to each of the operating modes and to provide the connected intermediate input values as the input values of the current driving circuit.

3. The semiconductor memory device of claim 2, wherein the current driving circuit receives the plurality of initial input values through the switch, and changes the direction of a magnetically induced current according to a logic combination of the intermediate input values, and the magnetic memory cell has a different resistance according to the direction of the magnetically induced current.

4. The semiconductor memory device of claim 2, wherein the mode input value generating unit further includes a control unit to provide the control signal corresponding to each of the operating modes to the switch.

5. The semiconductor memory device of claim 1, wherein the magnetic memory cell includes:
    at least one magnetic induction layer having a magnetic direction according to the direction of the magnetically induced current; and
    a resistance-variable element to vary its resistance according to the magnetic direction of the magnetic induction layer.

6. The semiconductor memory device of claim 2, wherein the current driving circuit receives three intermediate input values and changes the direction of the magnetically induced current according to a logical combination of the three intermediate input values.

7. The semiconductor memory device of claim 6, wherein the logical combination of the three intermediate input values corresponds to the logical sum of the logical product of a first intermediate input value and a second intermediate input value, the logical product of a second intermediate input value and the third intermediate input value, and the logical product of the third intermediate input value and the first intermediate input value.

8. The semiconductor memory device of claim 2, wherein the current driving circuit receives a single fixed intermediate input value and two intermediate input values from the switch and changes the direction of the magnetically induced current according to a logical combination of the fixed intermediate input value and the two intermediate input values.

9. The semiconductor memory device of claim 2, wherein the current driving circuit receives two intermediate input values and changes the direction of the magnetically induced current according to a logical combination of the two intermediate input values.

10. The semiconductor memory device of claim 5, wherein the resistance-variable element comprises:
    a fixed magnetic layer having a fixed magnetic direction irrespective of the direction of the magnetically induced current; and
    a free magnetic layer having a magnetic direction according to the direction of the magnetically induced current,
    wherein the resistance-variable element varying its resistance according to the magnetic directions of the fixed magnetic layer and the free magnetic layer.

11. The semiconductor memory device of claim 10, wherein the resistance-variable element further comprises an insulating layer disposed between the fixed magnetic layer and the free magnetic layer.

12. The semiconductor memory device of claim 5, wherein the magnetic memory cell further comprising a pair of resistance measurement lines measuring the resistance.

13. The semiconductor memory device of claim 5, wherein the magnetic induction layer comprises a metal line.

14. A method of programming a semiconductor memory device comprising:
    changing a connection state between input values of a current driving circuit so as to correspond to each of at least two operating modes, and defining a logic function of a magnetic memory cell connected to the current driving circuit, in response to each operating mode; and
    performing a logic operation on the logic functions of at least two magnetic memory cells defined according to each of the operating modes and generating a result of logic operation.

15. The method of claim 14, wherein the defining of a logic function of a magnetic memory cell includes connecting a plurality of initial input values to a plurality of intermediate input values according to a predetermined control signal so as to correspond to each of the operating modes and providing the connected intermediate input values as the input values of the current driving circuit.

16. The method of claim 14, wherein the defining of a logic function of a magnetic memory cell includes changing the direction of a magnetically induced current according to a logic combination of intermediate input values provided corresponding to each of the operating modes such that the magnetic memory cell has a different resistance according to the direction of the magnetically induced current.

17. The method of claim 14, wherein the defining of a logic function of a magnetic memory cell includes providing the control signal corresponding to each of the operating modes.

* * * * *